(12) United States Patent
van 't Spijker et al.

(10) Patent No.: US 7,019,908 B2
(45) Date of Patent: Mar. 28, 2006

(54) MODULATOR CIRCUITRY

(75) Inventors: Johannes Christiaan van 't Spijker, Delft (NL); Marco Jan-Jaco Wieland, Delft (NL); Ernst Habekotte, Delft (NL); Floris Pepijn van der Wilt, Delft (NL)

(73) Assignee: Mapper Lithography IP B.V., CJ Delft (NL)

( * ) Notice: Subject to any disclaimer, the term of this patent is extended or adjusted under 35 U.S.C. 154(b) by 0 days.

(21) Appl. No.: 10/909,167

(22) Filed: Jul. 29, 2004

(65) Prior Publication Data
US 2005/0062950 A1 Mar. 24, 2005

Related U.S. Application Data

(60) Provisional application No. 60/491,475, filed on Jul. 30, 2003.

(51) Int. Cl.
G02B 27/10 (2006.01)
G02B 26/00 (2006.01)

(52) U.S. Cl. .................. 359/619; 359/618; 359/291

(58) Field of Classification Search ............... 359/298, 359/245–251, 618, 619, 291, 855, 224; 385/17–19, 385/24; 708/816; 355/67; 345/697
See application file for complete search history.

(56) References Cited

U.S. PATENT DOCUMENTS

| | | | | |
|---|---|---|---|---|
| 5,521,748 A | * | 5/1996 | Sarraf ...................... 359/321 |
| 6,312,134 B1 | * | 11/2001 | Jain et al. .................. 359/855 |
| 6,870,554 B1 | * | 3/2005 | Jain ........................... 345/697 |
| 2003/0081303 A1 | | 5/2003 | Sandstrom ................ 359/291 |

FOREIGN PATENT DOCUMENTS

WO    WO 03/040829    5/2003

* cited by examiner

Primary Examiner—Ricky L. Mack
Assistant Examiner—M. Hasan
(74) Attorney, Agent, or Firm—Blakely Sokoloff Taylor & Zafman

(57) ABSTRACT

The invention relates to a modulator for modulating the magnitude of a beamlet in a multi-beamlet lithography system, said modulator comprising at least one means for influencing the direction of a beamlet, a light sensitive element for receiving light from a modulated light beam and converting said light into a signal, and discretizing means, coupling to said light sensitive element and to at least one of means for influencing, for converting said signal received from said light sensitive element into a discrete signal having discrete values selected from a set of predefined discrete values and providing said discrete signal to said means for influencing.

27 Claims, 20 Drawing Sheets a.

b.

c.

d.

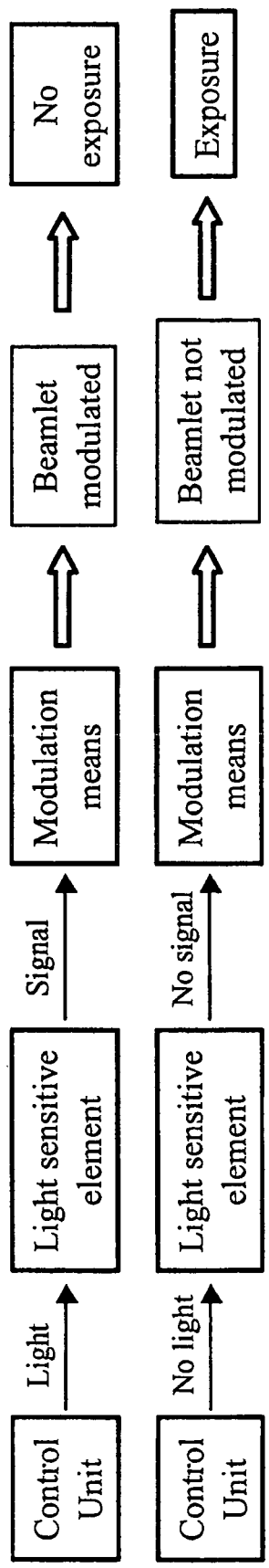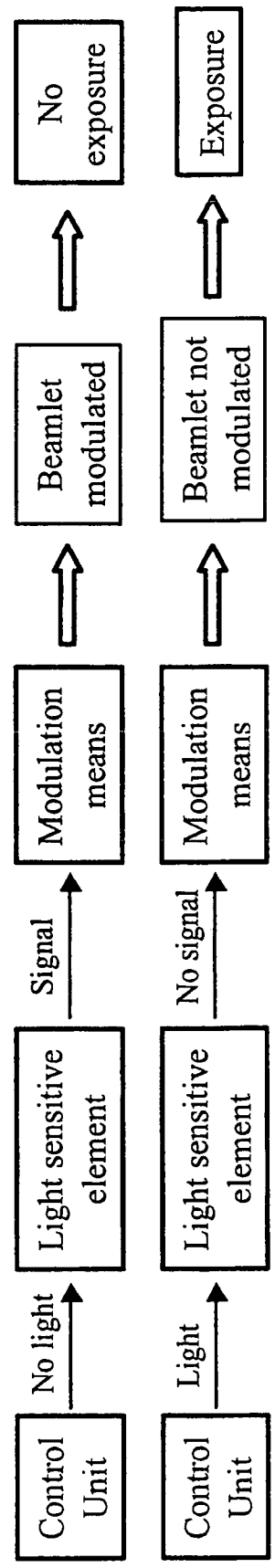
Figure 1a
Figure 1b

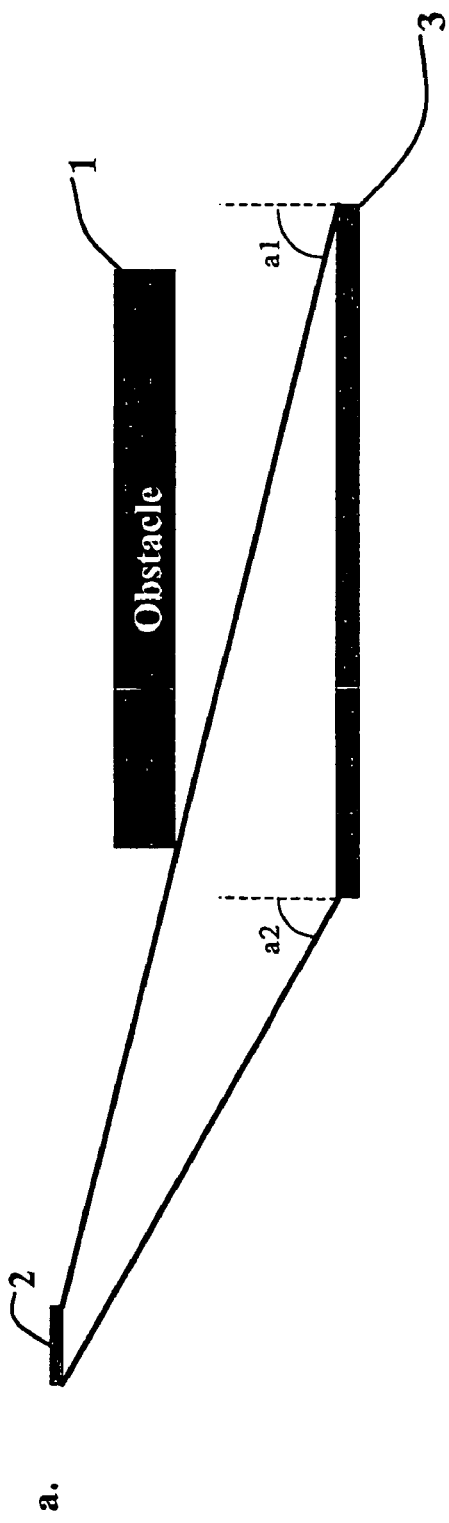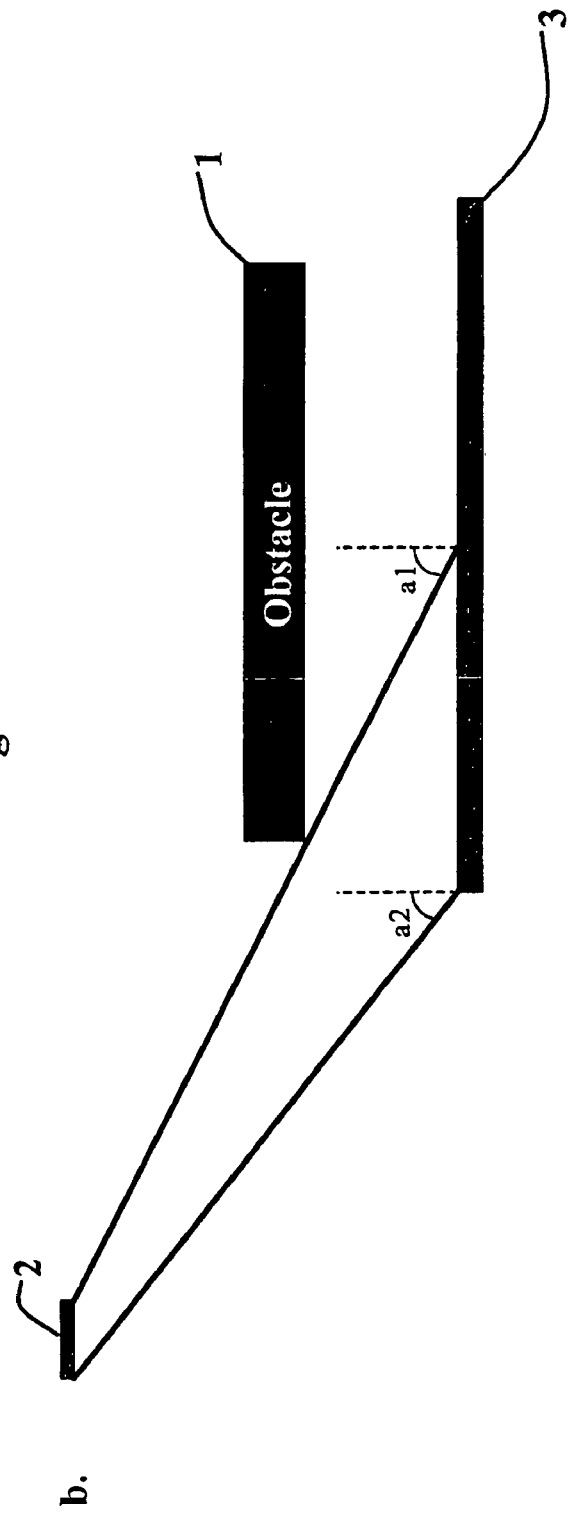
Figure 2a
Figure 2b

Etc.

Etc.

MODULATOR CIRCUITRY

This application claims the benefit of Provisional Application No. 60/491,475, filed Jul. 30, 2003.

BACKGROUND

The invention pertains to a modulator for modulating the magnitude of a beamlet in a multi-beamlet lithography system, in particular for a maskless lithography system.

Maskless lithography systems, including ion, laser, EUV and electron beam systems, all require means to process and deliver pattern data to some kind of writing means. Since a mask is a highly efficient way to store a pattern, the amount of raw data to describe a pattern is enormous. Moreover, for a commercially acceptable throughput, the data must be transported towards the writing means at a very high data rate. Additionally the high data rate must be obtained within limited space. It was up to now not recognized that improvement of the data path in maskless lithography systems has a profound effect on the throughput of these systems.

All maskless lithography systems can be divided in two classes. In the first class, the data are sent towards the individual radiation source or sources. By tuning the intensity of the sources at the right times, a pattern can be generated on the substrate, which is most often a wafer. The switching of sources may get problematic when the switching speed increases. The settling time of a source can for instance be too long.

The second class of maskless lithography systems on the other hand comprises either continuous sources or sources operating with a constant frequency. The pattern data are now sent towards modulation means, which completely or partly stop the emitted beams from reaching the target exposure surface when necessary. By controlling these modulation means while moving over the target exposure surface, a pattern is written. The modulation means are less critical for settling times. A lot of maskless lithography systems designed to achieve a higher throughput are therefore using modulation means.

Canon discloses in U.S. Pat. Nos. 5,834,783, 5,905,267 and 5,981,954 a maskless electron beam lithography system with one electron source. The emitted electron beam is expanded, collimated and additionally split by an aperture array into a plurality of beamlets. A blanker array fed with pattern data stops the individual beamlets when a control signal is given. The obtained image is then reduced by a reduction electron optical system and projected on a wafer.

Advantest on the other hand discloses a maskless electron beam lithography system in patent applications US20010028042, US20010028043, US20010028044, WO02054465, WO02058118 and WO02058119, wherein a plurality of electron sources is used. The emitted electron beamlets pass a blanker array, which deflects the individual electron beamlets when the appropriate control signal is given. Furthermore the passing electron beams are shaped by a shaping array, and eventually focused on the wafer.

Micronic describes in for instance patent application WO0118606 and U.S. Pat. No. 6,285,488 an optical lithography system that uses a spatial light modulator (SLM) to put information into the emitted light beam. A light source emits light pulses directed towards the SLM. The SLM comprises an array of deformable mirrors, which reflect the emitted beam towards a substrate or towards a beam stop structure depending on the control signal sent to the mirror involved.

The information on a mask is normally used to transfer a pattern from the mask on a certain area on the target exposure surface. This area is called a die. To get an idea of the amount of data that has to be transferred, imagine a die of 32 mm by 26 mm. Now consider that somebody wants to write a pattern with a critical dimension (CD) of 45 nm. Then there are $4,1*10^{11}$ CD-elements on a die. If each CD element consists of at least $30*30$ pixels to satisfy the requirements, and if there is only one bit needed to represent the intensity of said pixel, the information present on a mask is represented by about $3,7*10^{14}$ bits. Say a commercially acceptable throughput for a maskless lithography system is about 10 wafers/hr. If there are 60 dies on a wafer, 60 times $3,7*10^{14}$ bits have to be transported towards the modulation means per wafer. So 600 times $3,7*10^{14}$ bits have to be transported towards the modulation means in 3600 seconds to get the desired throughput. This corresponds to a data transfer rate of about 60 Tbit/s!

In all mentioned systems the control signals are sent electronically towards the modulation means. However, the bandwidth of a metal wire is limited. The limit on the bandwidth of an electrical interconnect is related to the maximum total capacity of an electrical interconnect $B_{max}$, to the overall cross-section A and the length of the electrical interconnect L in the following way:

$$B_{max} = B_0 * (A/L^2)$$

The constant of proportionality $B_0$ is related to the resistivity of copper interconnects. For typical multichip module (MCM) technologies $B_0$ is about $10^{15}$ bit/s. For on-chip lines its value is about $10^{16}$ bit/s. The values are almost independent on the particular fabrication technology.

The limit on the bandwidth of the electrical interconnect is furthermore independent of its configuration. Whether the interconnect is made up of many slow wires or a few fast wires up to the point where other effect start to limit the performance makes no difference.

The desired total capacity of the electrical interconnect is $100*10^{12} = 10^{14}$ bit/s. This corresponds to a ratio of the overall cross-section to the square of the length of the electrical interconnect of $10^{-1}$ in the case of a MCM and $10^{-2}$ in the case of an on-chip connection. So if L is 1 m, the overall cross-section of copper is 0,01–0,1 m$^2$! Compare that number with the size of a die that is written, which is 0,0008 m$^2$, and it is evidently impossible to establish the data transfer without a demagnification of at least 10 after the pattern information is added to the light beam.

Another approach to visualize the problem is to use the typical speed of an electrical interconnect, which is in the order of 1 Gbit/s. So to transfer 100 Tbit/s, 100.000 copper wires are needed! This takes an enormous amount of space and is difficult to handle.

In U.S. provisional application 60/421,464, filed on Oct. 25, 2002, incorporated by reference, as a solution to this problem it is suggested to feed pattern data using optical transmission means.

SUMMARY OF THE INVENTION

An objective of the current invention is to improve the systems described above.

A further or other objective of the current invention is to provide a modulator which enables stable operation of an optical or charged particle beam lithography system.

A further other objective of the current invention is to provide a modulator which improves the dose control.

The invention therefore provides a modulator for modulating the magnitude of a beamlet in a multi-beamlet lithography system, said modulator comprising:
- at least one means for influencing the direction of a beamlet;
- a light sensitive element for receiving light from a modulated light beam and converting said light into a signal;
- discretizing means, coupling to said light sensitive element and to at least one of means for influencing, for converting said signal received from said light sensitive element into a discrete signal having discrete values selected from a set of predefined discrete values and providing said discrete signal to said means for influencing.

Using optical data transportation means in a lithography system makes it possible to create a maskless lithography system based on known technology, but having an increased throughput and stability.

Furthermore, the discretizing means improve the reliability of a lithography system based on these modulators, as small fluctuation in the signal will not lead to unintended displacements and aberrations of the beamlets.

Furthermore, it provides a possiblity to control the dose more accurately.

In the context of the invention, the word 'light' is used in the sense of optical (electromagnetical) radiation. In particular, optical radiation in a wavelength range of about 200 to about 2000 nm is used.

For generating beamlets which transfer the actual pattern onto the surface of a substrate, the radiation source that can be used can emit any kind of radiation having a short wavelength, like electrons, positrons, x-rays, photons or ions. The source is either a continuous source or a source that is pulsed with a continuous frequency. The source therefore does not generate any information, but only generates beamlets. However, the purpose of a lithography system is to pattern a certain target exposure surface. Since the source does not provide any pattern information, the pattern information has to be added to the beamlets somewhere along their trajectory by modulation means. It should in this invention be realized that the pattern information is transported using an optical system. The pattern information is used to control modulation means, which modulates beamlets, which actually write the pattern into a resist or in another way transfer the pattern onto a sample, for instance a semiconductor wafer. In the system, the nature of the pattern writing beamlets depends on the nature of the source. In fact, the modulated light beams are pattern information carrying light beam, and the beamlets are pattern-writing beamlets.

In an embodiment, the discretizing means comprises an electric circuit, operationally coupled to the light sensitive element and to the means for influencing the direction of a beamlet.

The modulation means can operate in different ways and be based on various physical principles, depending on the nature of the beamlets used for writing the pattern. It may generate a signal, which results in the activation of some blocking mechanism, which stops the beamlet, for instance a mechanical shutter or a crystal becoming opaque due to electro-acoustic stimulation. Another possibility is that the modulation means selectively generate a signal, which results in the activation of some sort of deflector element, like an electrostatic deflector or a mirror. This results in a deflection of the selected irradiated beamlet. The deflected beam is then projected on a blanker element, for instance a beam absorbing plate provided with apertures, aligned with the deflectors of mirrors. In both cases a commercially satisfactory throughput can only be acquired, when the beamlet modulation is done very fast, preferably with a frequency of 100 MHz or more.

In maskless lithography systems the pattern information is represented by computer data, generally digital computer data. The pattern data is partially or completely stored in the control unit. The control unit therefore comprises a data storage medium, e.g. RAM, hard disks or optical disk, for instance a plurality of these media provided in a parallel configuration. This data is stored in a format that can be used to control the modulation means in such a way that a predetermined pattern can be repetitively generated. Furthermore, the control unit comprises means to read out the data at a high data rate. To establish the high data rate the control unit comprises an element that converts the data into at least one pattern data carrying light beam. In an embodiment, this data converter comprises a vertical cavity surface emitting laser (VCSEL) diode. If a bit is one, a light signal is emitted while no light is sent out if the value of the bit equals zero, for instance. By reading out a sequence of bits, a pattern information carrying light beam is created. The pattern information carrying light beams are then transported towards the modulation means. There are several possible carriers that can realize the data transfer.

In an embodiment the transfer from the converter element in the control unit to a region close to the modulation means is achieved using optical fibers for the data transport. This allows flexible data transport with minimal disturbance by electromagnetic fields and other means.

Currently the optical fibers that are for instance used in telecom and Ethernet applications are optimized for specific wavelengths, predominantly 850, 1300 and 1500 nm. The 850 nm optimization is established due to the good availability of the standard InGaAs/GaAs laser diodes. The infrared wavelengths are used because of the low fiber transmission losses, typically smaller than 0.4 dB/km. Future developments aim for wavelengths of 660 and 780 nm. The lower wavelengths are preferred for the present invention because of fewer diffraction related limitations at these wavelengths. However, in some configurations larger wavelengths are desired. The wavelengths that can be used in the present invention are optical wavelengths and range from about 200 to 1700 nm. Current developments furthermore make it possible to transfer multiple signals through one channel. For this purposes either multi-wavelength or multimode optical fibers are developed, and multiplexing/demultiplexing techniques are used.

In an embodiment of the invention, each modulator of the modulation means comprises a light sensitive element for converting said at least one modulated light beam coming from said control unit into a signal for actuating said modulator. In a further embodiment thereof, said optical transmission means comprise at least one optical fiber for transmitting said at least one modulated light beam from said control unit to said modulation means. In this embodiment, said at least one optical fiber at its modulation means end is coupled to one or more optical fiber arrays. In a further embodiment thereof, substantially every optical fiber from said one or more optical fiber arrays is coupled to one of said light sensitive converter elements.

In an alternative embodiment, said at least one optical fiber at its modulation means end is coupled to one or more optical wave-guides, and said optical wave-guides being coupled to the light sensitive elements.

In an embodiment of the maskless lithography system described above, said optical transmission means comprise at least one multiplexer at its control means end and at least one demultiplexer at its modulation means end.

In another embodiment of the maskless lithography system described above, it has an optical path parallel to which said plurality of beamlets are traveling, wherein said optical transmission means are furthermore provided with optical coupling means for coupling said at least one modulated light beam into said optical path.

In embodiment described above, the data converter and the optical transmission means are adapted for generating at least one modulated light beam having at least one wavelength between 200 and 1700 nm.

In a further embodiment of the invention, each light sensitive element is provided with a selection filter, which is transparent for a predetermined wavelength range.

In an alternative embodiment, each light sensitive element is provided with a selection filter for transmitting light having a predetermined direction, or range of directions, of polarization.

In another alternative embodiment, each light sensitive element comprises a prism which limits the sensitivity of said light sensitive element to light entering said prism from a predetermined direction, of range of directions.

In yet another embodiment, each light sensitive element comprises a grating, which limits the sensitivity of said light sensitive element to light entering said grating from a predetermined direction, or range of directions.

In a further embodiment of the maskless lithography system comprising optical fibers, said light sensitive element comprises a photodiode, in an embodiment a MSM-photodiode, a PIN-photodiode or an avalanche photodiode.

In an embodiment of the maskless lithography system with an optical fiber array, the modulator comprises an electrostatic deflector.

In an embodiment of the maskless lithography system according to the present invention, the data converter comprises a laser diode.

In an embodiment wherein the source comprises an electron beam generating means, each modulator of the modulation means comprises a light sensitive element for converting said at least one modulated light beam coming from said control unit into a signal for actuating said modulator, said modulation means has a beam generating means side and a target side, each of said modulators comprises at least one electrostatic deflector, an aperture between said at least one electrostatic deflector and said target side, said electrostatic deflectors of said modulators make up an electrostatic deflector array and said apertures of said modulators make up an aperture array, each electrostatic deflector is coupled to a light sensitive element, the light sensitive elements are located at the beam generating side of said modulation means and said electrostatic deflectors are located between said light sensitive elements and said aperture array. In this embodiment, said optical transmission means comprise beam splitting means for splitting said at least one modulated light beam into a plurality of modulated light beams, and optical couplers for coupling each modulated light beam to a light sensitive element.

In this embodiment, said optical couplers comprise projecting means for projecting said plurality of modulated light beams on said light sensitive elements at an angle between 0 and 80 degrees relative to a plane perpendicular to said electrostatic deflector array. In this embodiment, the projecting means comprise at least one lens for projecting the plurality of modulated light beams on said electrostatic deflector aperture array.

In an embodiment of the electron beam maskless lithography system, the projecting means comprise a first demagnifier with a reduction optical system for demagnifying the plurality of modulated light beams and a projection optical system for projecting the demagnified plurality of modulated light beams on said electrostatic deflector aperture array. In an embodiment thereof, said reduction optical system comprises a micro lens array, each micro lens of said micro lens array being aligned with one of said plurality of modulated light beams and adapted for reducing the size of said one of said modulated light beams. In a further embodiment thereof, said projection optical system further comprises a mirror, for reflecting the plurality of modulated, demagnified light beams coming from the reduction optical system in the direction of said lens of the projection optical system.

In an embodiment of the electron beam maskless lithography system described above, the area on the modulation means not covered by the light sensitive elements is provided with a reflective layer.

In an embodiment of the electron beam maskless lithography system described above, a diffusive layer is provided on the surface of the modulation means facing the incoming plurality of modulated light beams.

In an embodiment of the electron beam maskless lithography system described above, said optical transmission means further comprises an optical wave guide for coupling each of the plurality of modulated light beams substantially parallel to the electrostatic deflector aperture array plane through said array towards its corresponding light sensitive element. In a further embodiment thereof, the optical transmission means further comprises an optical micro lens array provided with a plurality of micro lenses, each micro lens being aligned with one of said plurality of modulated light beams for coupling its modulated light beam into a corresponding optical wave-guide.

In an embodiment of the electron beam maskless lithography system described above, the optical transmission means comprising a plurality of optical fibers, the data converter means comprising means for operationally coupling said at least one modulated light beam to or in said plurality of optical fibers, said plurality of optical fibers being grouped to form at least one fiber ribbon, said at least one fiber ribbon being attached at one of the sides of said electrostatic deflection array, and the light sensitive elements being adapted for electrically activating their corresponding electrostatic deflector via electrical interconnects.

In another embodiment, the maskless lithography system, the generating means comprise light beam generating means. In an embodiment thereof, the light generating means are adapted for generating a light beam having a wavelength smaller than 300 nm. In a further embodiment thereof, the modulation means comprises a spatial light modulator. In a further embodiment thereof, the spatial light modulator comprises a deformable mirror device, comprising an array of micro-mirrors. In yet a further embodiment thereof, each micro-mirror comprises a light sensitive element mounted on its backside coupled to said optical transmission means for receiving a modulated light beam.

The invention further relates to a process wherein a maskless lithography system is used described above.

The invention further relates to a method for transferring a pattern onto the surface of a target using a lithography system comprising beam generating means for generating a plurality of beamlets and modulation means for individually controllably modulating substantially each beamlet, said method comprising:

retrieving pattern data from data storage means;

transforming said pattern data into at last one modulated light beam;

optically coupling said at least one modulated light beam to said modulation means.

In an embodiment of this method the modulation means comprise an array of modulators, each provided with light sensitive elements, and method further comprises:

splitting said at least one modulated light beam into a plurality of modulated light beams;

coupling each of said modulated light beams to one light sensitive element.

In an embodiment, the modulator according to the invention further comprises a passage for said beamlet, wherein said means for influencing are located near said passage;

In a further embodiment thereof, this modulator is a modulator for modulating the magnitude of a charged particle beamlet in a multi-beamlet charged particle lithography system, said means for influencing comprising at least one electrode, located near said passage for generating an electrical field for influencing said charged particle beamlet, and said discretizing means coupling to said light sensitive element and to at least one of said at least one electrodes.

In a further embodiment, the modulator according to the invention is a modulator for modulating the magnitude of an optical beamlet in a multi-beamlet lithography system, said means for influencing being located in the optical path of said beamlet.

In an embodiment thereof, said means for influencing comprises at least one deflector for deflecting an optical beamlet.

In a further embodiment thereof, the modulator further comprises means for modifying the deflection angle of the deflector, said means for modifying being coupled to said discretizing means.

In an embodiment of the modulator of the current invention, said discretizing means comprises at least one comparator circuit, which provides the functionalities of:

providing a first difference between said signal and a reference signal;

providing a second difference between at least one threshold value and said first difference;

providing a discrete value selected from said set of predefined discrete values, based on the magnitude of said second difference.

In an embodiment of the modulator of the current invention said discretizing means comprises a discretizing circuit comprising:

A first differentiator, coupled to said light sensitive element, for calculating a first differential signal from the signal and a reference signal, A second differentiator, coupled to said first differentiator, for calculating a second differential signal from said first differential signal and a threshold signal;

A converter, coupled to said second differentiator for converting said second differential signal into discrete values, selected from said set of predefined discrete values.

In an embodiment of the modulator of the current invention said signal is a time-varying electrical potential.

In an embodiment of the modulator of the current invention said signal is a time-varying electrical current.

In an embodiment thereof, the discretizing circuit is an inverter circuit comprising a transistor of the PMOS-type and a transistor of the NMOS-type.

In a further embodiment thereof, the discretizing circuit comprising a number of inverters in series, wherein at least one inverter is provided with a transistor of the PMOS-type and a transistor of the NMOS-type, In yet a further embodiment thereof, said number of inverters in series is an even number.

In an embodiment thereof, each consecutive inverter in said number of inverters in series comprises transistors designed to operate with a higher current than the transistors in the previous inverter in said number of inverters in series.

The invention further relates to a modulator array comprising a plurality of modulators, for modulating the magnitude of plurality of beamlets in a multi-beamlet lithography system, each modulator comprising:

at least one means for influencing the direction of a beamlet;

a light sensitive element for receiving light from a modulated light beam and converting said light into a signal;

discretizing means, coupling to said light sensitive element and to at least one of means for influencing, for converting said signal received from said light sensitive element into a discrete signal having discrete values selected from a set of predefined discrete values and providing said discrete signal to said means for influencing.

The invention further relates to a method for transferring a pattern onto the surface of a target using a lithography system comprising beam generating means for generating a plurality of beamlets and modulation means for individually controllably modulating substantially each beamlet, said method comprising:

retrieving pattern data from data storage means;

transforming said pattern data into at last one modulated light beam;

optically coupling said at least one modulated light beam to said modulation means comprising an array of modulators with at least one modulator for each beamlet, each modulator comprising:

at least one means for influencing the direction of a beamlet;

a light sensitive element for receiving light from a modulated light beam and converting said light into a signal;

discretizing means, coupling to said light sensitive element and to at least one of means for influencing, for converting said signal received from said light sensitive element into a discrete signal having discrete values selected from a set of predefined discrete values and providing said discrete signal to said means for influencing.

DRAWINGS

The invention will be further elucidated in the following embodiments of a maskless lithography system according to the current invention, in which:

FIG. 1a, 1b a an operation scheme of part of the system of the invention;

FIG. 2a, 2b, 2c free space optical coupling,

FIG. 3a, 3b illumination schemes of a modulation means;

FIG. 4 projection of optical fiber array on modulation array;

FIG. 5a, 5b projection systems for projecting a pattern information carrying light beam on modulation means;

FIGS. 6a–6d illuminating schemes for the light sensitive elements;

FIG. 7 coupling of pattern information carrying light beams to light sensitive elements;

FIG. 8 top-view of FIG. 7;

FIG. 9 optical coupling using optical fiber ribbons;

FIG. 10 modulation means for an electron beam lithography system,

FIG. 11 free space coupling of pattern information carrying light beams to modulation means;

FIG. 12 illumination scheme of a modulation means;

FIG. 13 maskless EUV lithography system;

DETAILED DESCRIPTION OF THE INVENTION

Figure 2C:
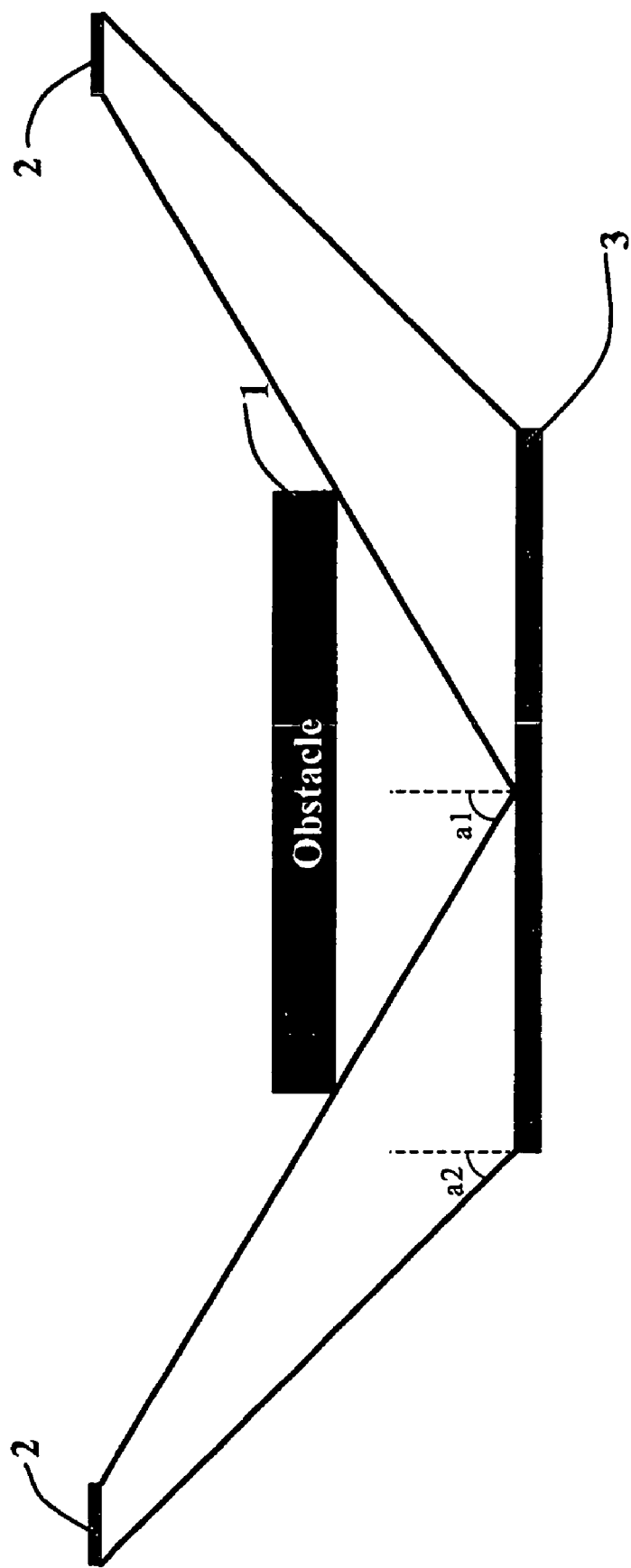

In the modulation means according to the invention, the modulation means are fed with an optical signal. Substantially each comprising a light sensitive element, preferably a photodiode. The basic operation of the modulation means is schematically shown in FIG 1a. A pattern information carrying light beam is sent from the control unit towards the light sensitive element.

If the light sensitive element receives light, a signal is generated and sent to modulation means. As a result the passing beamlet will be modulated and not reach the target exposure surface. If there is no light, there is no signal transferred to the modulation means. The beamlet passes undisturbed, and finally reaches the target exposure surface. By moving the target exposure surface and the rest of the lithography system relative to each other while sending pattern information towards the modulation means, a pattern can be written.

It is of course also possible to operate the whole system in the opposite way as shown in FIG 1b. In this case light falling on the light sensitive element results in the cancellation of the signal sent towards the modulation means. The passing beamlet will reach the target exposure surface without any modulation. However, when the light sensitive element does not receive light, a signal is sent towards the modulation means, which prevents the passing beamlet from reaching the target exposure surface.

The attachment of the optical fibers to the modulation means can give serious complications. In an embodiment, the last part of the data trajectory uses a different transfer medium. In the latter case the fibers terminate closely packed thus forming an optical fiber array. The emitted pattern information carrying light beams are then sent towards other optical carriers. When the modulation means are located in a vacuum, it might be preferable to keep the optical fibers outside the vacuum. In the latter case the emitted light beams can couple into the lithography system via a transparent part of the vacuum boundary.

In most cases it is not practical to bring the pattern information carrying light beams all the way to the light sensitive elements through optical fibers. In that case other optical carriers can continue the data transfer. Preferably the optical fibers are bonded together to form an optical fiber array. The pattern information carrying light beams then travel towards the light sensitive elements in a different way. One possible way of data transfer is to send the light emitted from the fibers towards the light sensitive elements of the modulation means through the same environment as wherein the irradiated beamlets are traveling. In this way free space optical interconnects are created. Another possible transport medium is an optical wave-guide, which is located in the structure of the modulation means.

In the case of an optical wave-guide or an optical fiber multiple wavelengths can be transported through the channels as is commonly done in telecommunication applications. The space occupied by the transfer medium then reduces significantly, because several pattern information carrying light beams share the same channel. The conversion towards a signal that can be used by the modulators can be made with an opto-electronic receiver, like a DWDM multi-wavelength receiver.

The light sensitive element can be any element known in the art that converts an incoming light signal into any other kind of signal, like an electric or an acoustic signal. Examples of such converters are photo cathodes, phototransistors, photo resistances and photodiodes. In order to meet the high data rate requirements, the light sensitive element should have a low capacitance, enabling it to operate at a high frequency. Moreover the element is preferably easy to integrate in the modulation means. There are photodiodes that meet the demands mentioned above. The preferred embodiment uses an MSM-photodiode. The main advantage of this photodiode is its low capacitance. It is therefore able to operate at a high frequency. Moreover, the fabrication of a MSM-photodiode is relatively easy. Another good option would be the use of a PIN-photodiode. This element also has a low capacitance, but it is somewhat more difficult to integrate this component in an array. Another very useful option is an avalanche photodiode.

As already mentioned earlier, the data rate and thus the modulation frequency are very high. In order to be able to modulate at this rate suitable switching circuitry is important. Next to the three optical carriers, which will be discussed below, other related means to transfer modulated light beams are embodied by the present invention.

Transfer Options

Free Space Optical Interconnects

When the pattern information carrying light beams are projected on the corresponding light sensitive elements through the same medium as wherein the irradiated beamlets are traveling, several complications arise. It is often not possible to project the pattern information carrying light beams on the light sensitive elements perpendicular to the plane wherein the light sensitive element is located. This can for instance be the case when the irradiated beamlets are already projected perpendicular to said plane. Interference between the beamlet and the pattern information carrying light beam might have an influence on the pattern, which results in an incorrect data transfer from control unit towards target exposure surface. To avoid this problem the pattern information carrying light beams reach the light sensitive surface of the light sensitive element, say a photodiode, at a certain angle. However, when this angle of incidence $\alpha$ increases, the spot size of the pattern information carrying light beams on the light sensitive surface of the photodiode increases as well. In order to address every photodiode individually the spot size of the pattern information carrying light beams should be less than the light sensitive surface area of the photodiode. The angle of incidence $\alpha$ should therefore be as small as possible. However, this is not always possible due to obstacles as shown in FIG. 2a.

Of course with a smart choice of the location of the fiber array 2 and the obstacle 1 most often a problem is avoided. However, this is not always possible. The present invention includes ways to reduce the angle of incidence $\alpha$ without said removal or replacement of the obstacle 1. First of all, the obstacle 1 can be made transparent to the pattern information carrying light beams. If the barrier is for instance an electrostatic lens array, it may be made of some kind of conductive glass or polymer. Alternatively, the wavelength of the pattern information carrying light beams can be chosen in such a way that the obstacle 1 becomes transparent for these beams. Silicon, for instance, becomes transparent to wavelengths larger than 1100 nm. So when a wavelength of 1500 nm, used in standard fiber applications, is used, the emitted beams will pass a silicon barrier without noticing its existence.

Another possibility to reduce the angle of incidence $\alpha$ without removing the obstacle 1 is to use more optical fiber arrays 2. In FIG. 2a a situation is sketched wherein the pattern information carrying light beams leaving the fiber array 2 are projected on a plate 3 provided with modulators. The emitted beams cover the total plate 3. If in this configuration the projected spot size is too large, the angle of incidence can be reduced by moving the fiber array 2 away from the modulation means plate 3 perpendicular to the plane wherein the photodiodes are deposited as is shown in FIG. 2b. As a result the critical angle of incidence $\alpha_1$ is reduced. Now the spot size may be limited within the requirements. However, only half of the plate 3 is illuminated. By using a second fiber array 2 at the same height at the opposite side of the modulation plate 3 as shown in FIG. 2c, the entire plate 3 is illuminated and the spot size is small enough. Both optical fiber arrays 2 comprise half the amount of fibers compared to the original one. By selecting the right amount of optical fiber arrays 2, a plate provided with an array of light sensitive elements can be illuminated with the desired angle of incidence $\alpha_1$.

Figure 3A:
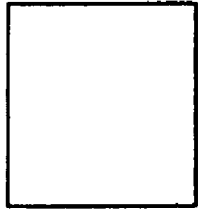
Figure 3A:
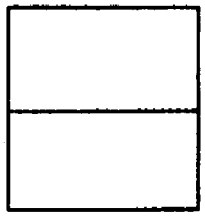
Figure 3A:
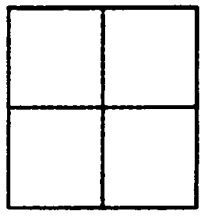
Figure 3A:
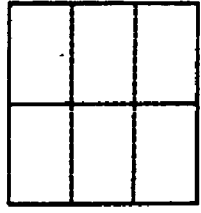
Figure 3A:
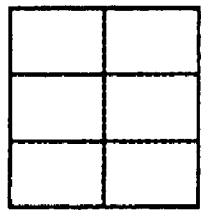
Figure 3A:
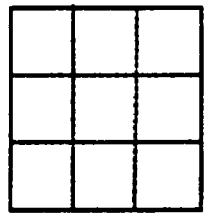
Figure 3B:
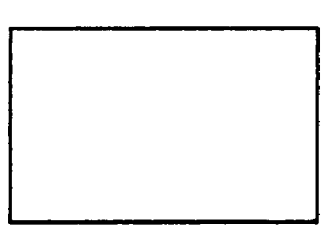
Figure 3B:
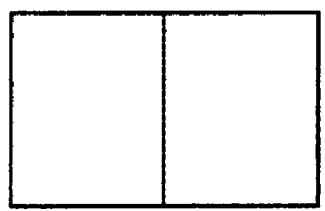
Figure 3B:
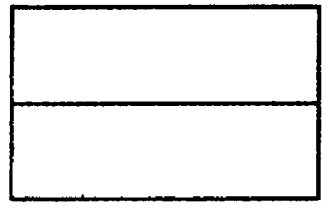
Figure 3B:
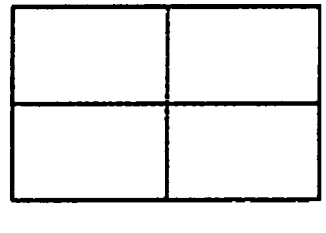
Figure 3B:
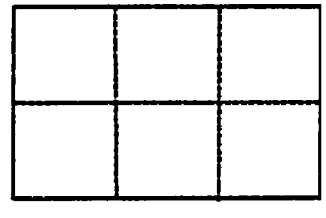
Figure 3B:
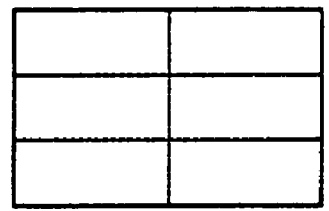

FIGS. 3a and 3b show a top view of a squared and a rectangular modulation plate 3. The dotted lines bound the area illuminated by one fiber array. As already explained earlier, one fiber array may not be enough. In that case for instance 2,4 or 6 optical fiber arrays 2 can be used to illuminate the entire plate within the requirements.

Furthermore it is possible to couple the pattern information carrying light beams into the system via some reflections. The obstacle 1 can for instance be coated with a reflective material. Moreover additional mirrors can be placed on strategic positions in the system to create the desired angle of incidence.

The pattern information carrying light beam has a diameter of about 50–150 μm when it leaves the optical fiber residing in the optical fiber array in the case that a multimode optical fiber is used. A single mode fiber only has a diameter of about 1–10 μm. The light sensitive surface of a photodiode can be in the order of 10–30 microns squared. In an embodiment, multimode optical fibers are used, so the diameter of the pattern information carrying light beams leaving the optical fiber array need to be reduced. Furthermore some kind of focusing has to be arranged to realize a projection with the correct resolution.

Figure 4:
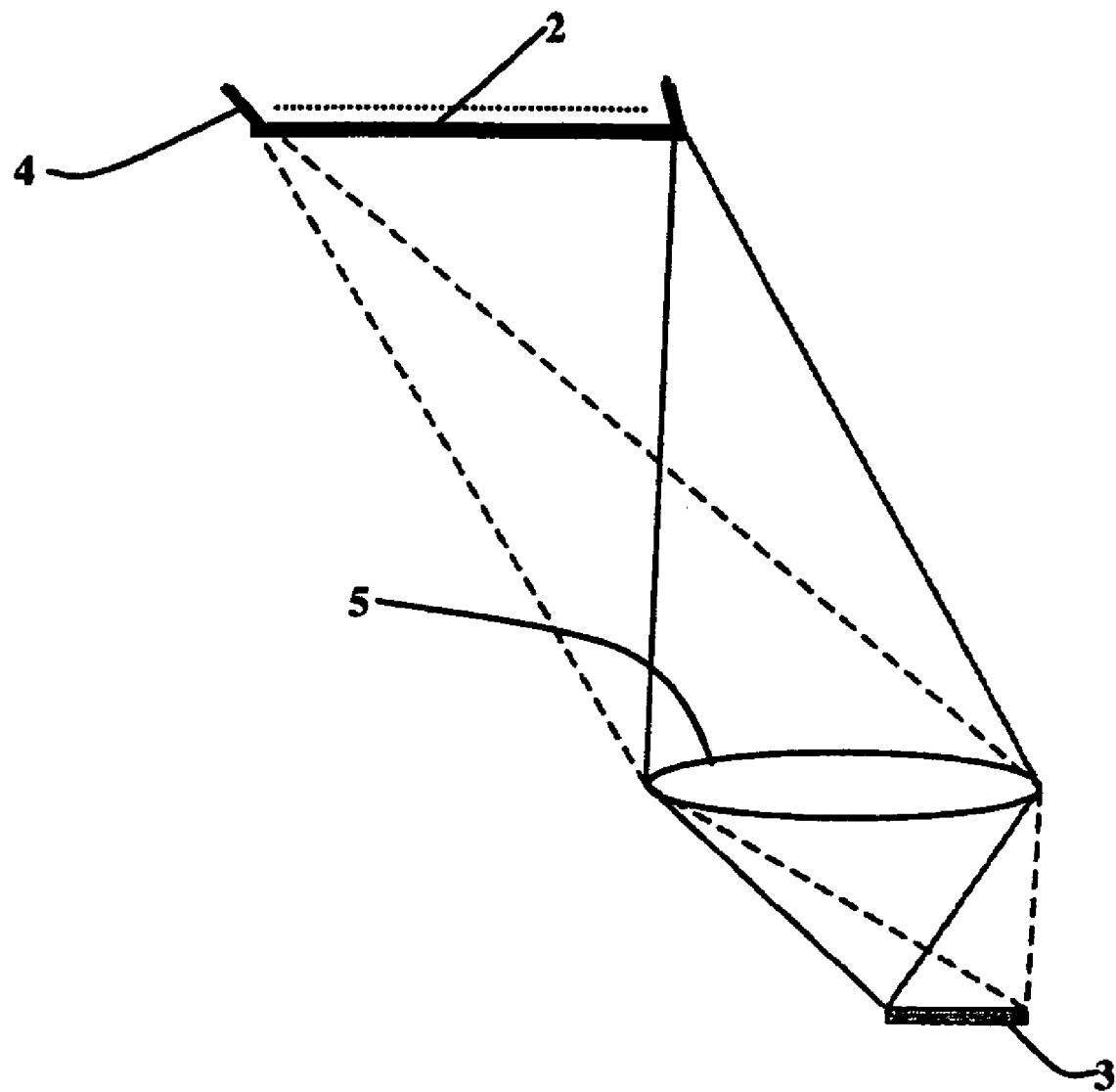

An optical assembly may be needed to perform both reduction and in focus projection of the pattern information carrying light beams. There are two properties of the fiber array that can be reduced. First the diameter of the light beams leaving the optical fiber array 2 can be demagnified. Secondly the distance between two adjacent light beams, the so-called pitch, can be reduced by optical means. The in focus projection of the light beams leaving the optical fiber array 2 on the modulation plate 3 can most easily be achieved when both optical fiber array 2 and modulation array 3 are lying parallel to each other. If the two planes are not parallel the spot size of each individual light beam on the modulation array 3 will vary. The projection of the fiber array 2 on the modulation plate 3 is done with a lens 5. Often the light beams are projected on the modulation plate 3 with an angle of incidence unequal to zero. The optical fibers 4 in the optical fiber array 2 may then be arranged in such a way that the light beam leaving the optical fiber is directed towards the lens as is shown in FIG. 4. In this way a sufficient illumination of the lens 5 is ensured.

When the lens 5 is located exactly in the middle between the optical fiber array 2 and modulation plate 3, 1:1 projection takes place. Moving the lens towards the modulation plate 3 reduces both diameter and pitch of the pattern information carrying light beams. Moving the lens 5 in the other direction, i.e. in the direction of the optical fiber array 2, will result in an increase of both parameters.

Figure 5:
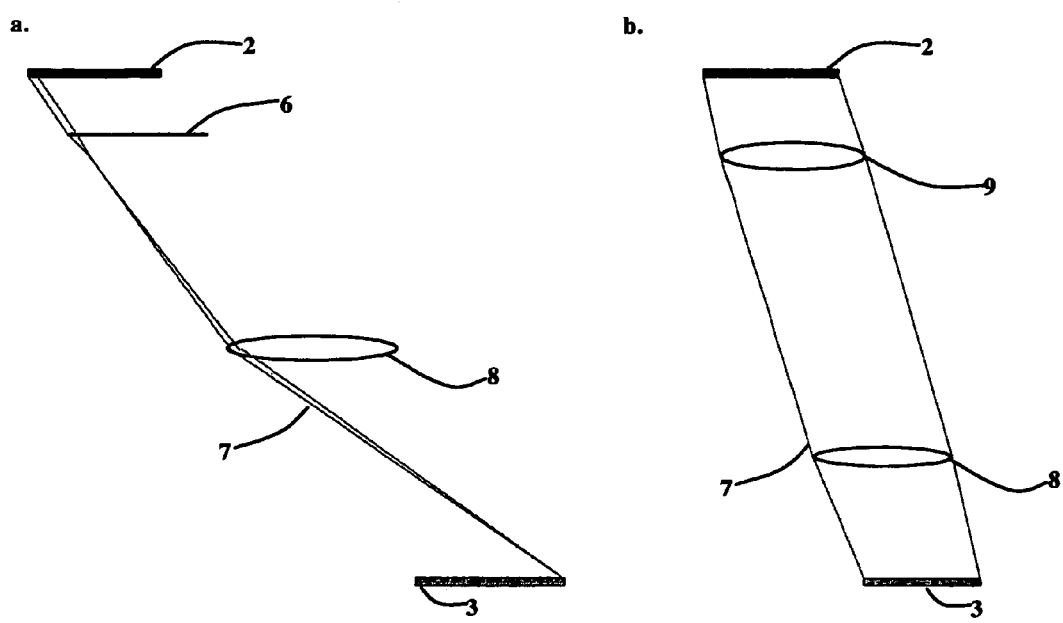

For an optimum performance regarding both reduction and projection more lenses may be needed. A possible configuration with two lenses 6 and 7 is shown in FIG. 5a. The entire image and thereby the diameter of every individual pattern information carrying light beam 5 leaving the optical fiber array 2 is reduced. In an embodiment with obstacles, mirrors can be used to project the light beams on the light sensitive elements.

In some cases the beam diameter needs to be reduced more than the pitch between the adjacent light beams 8. A micro lens array 9 positioned between the optical fiber array 2 and a projection lens 7 can arrange this. Each individual lens corresponds to a single fiber 4 in the optical fiber array 2. The diameter of each pattern information carrying light beam 8 leaving the optical fiber array 2 is individually demagnified in this configuration as depicted in FIG. 5b. A projection lens 7 focuses all demagnified beams onto the corresponding light sensitive elements. When direct projection is impossible due to some obstacle, mirrors can be used to project the pattern information carrying light beams on the light sensitive elements at the desired angle of incidence $\alpha$.

Another potential problem related to the spot size is cross talk between adjacent pattern information carrying light beams emitted from the fiber array 2. Applying several measures can reduce this cross talk. Consider again that the beams are projected on an array of modulation means wherein the light sensitive surfaces of for instance photodiodes are all lying within one plane at one side of the array.

Figure 6:
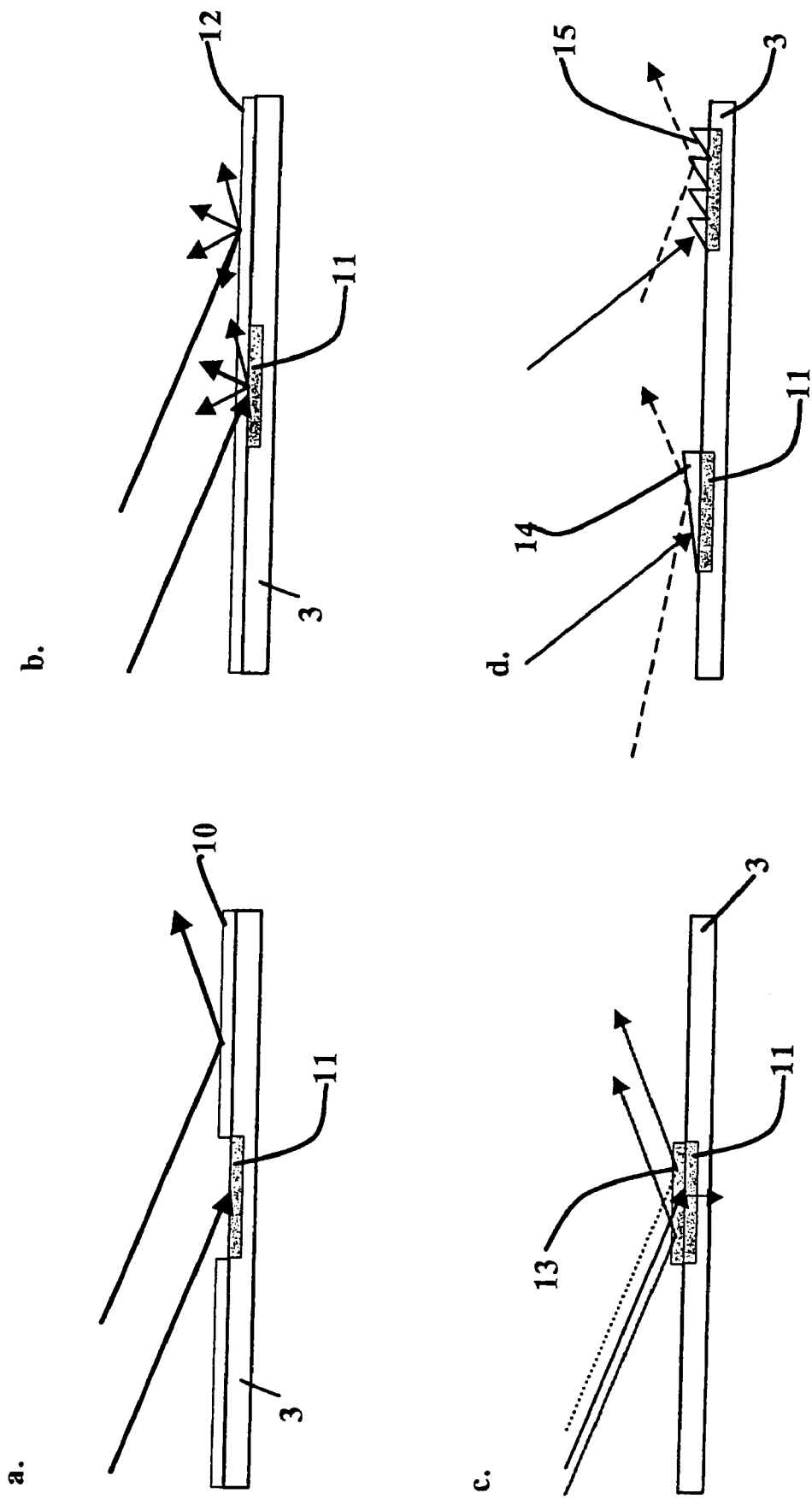

A first solution to the cross talk problem is depicted in FIG. 6a. The area between adjacent light sensitive elements is covered with a reflective layer 10. The major part of the incoming light beam falls on the light sensitive converter element 11. The part of the light beam that is not falling on the element 11 is reflected back into the system, without affecting any of the adjacent elements. Coating the light sensitive elements 11 with an anti-reflective layer can enhance the light detection efficiency even further.

A second measure to reduce the cross talk is the use of a diffusive layer 12 on top of the entire array 3 as shown in FIG. 6b. The incoming light is now scattered in all directions. Due to the scattering the light intensity of the reflected beam drops drastically. A disadvantage of this approach is that it demands a higher threshold level of the light sensitive element 11 to compensate for the increase of the background radiation.

A third way to reduce the cross talk is the use of a filter located on top of the light sensitive converter element 11. Examples are a wavelength filter 13 as shown in FIG. 6c, or a polarization filter. The wavelength filter 13 enhances the selectivity for a certain wavelength. As a result waves coming from adjacent patterned beams with a slightly different wavelength are filtered out. A filter, which only transmits light polarized in a predetermined direction works, can have the same effect.

Yet another possible measure is to make the light sensitive elements 11 only sensitive for light coming from a predetermined direction. This can be done by incorporating small prisms 14 or gratings 15 in the modulation array 3 as depicted in FIG. 6d. Only the light that falls on the light sensitive element 11 at the correct angle and coming from the right direction is used in the modulation process. Light coming from all other directions is excluded.

Optical Wave-guides

Figure 7:
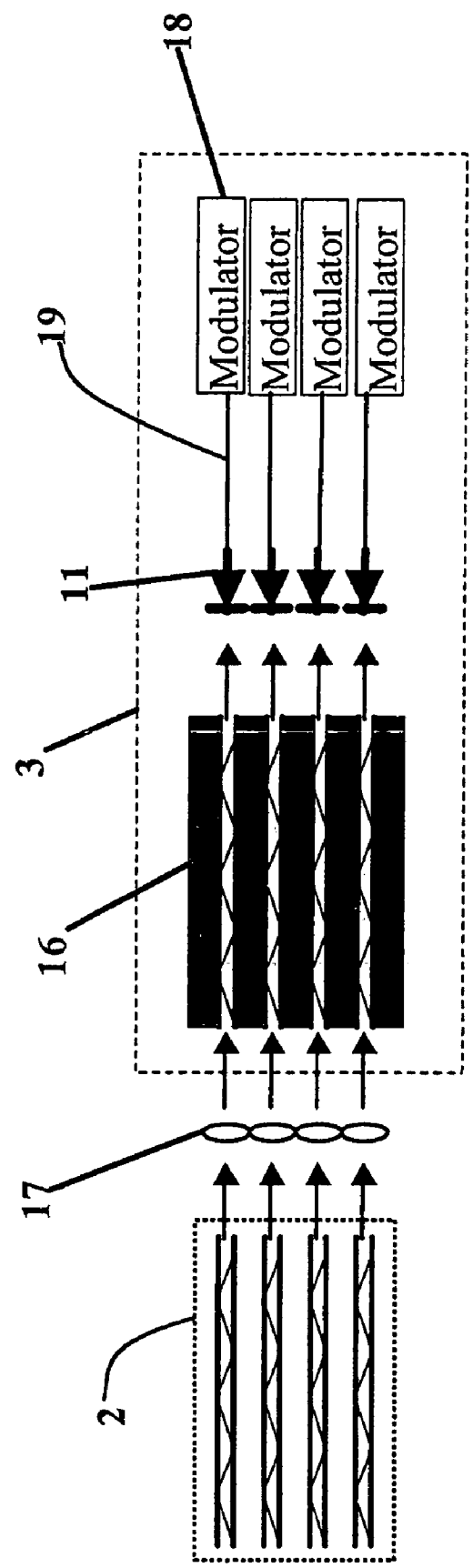

A second possibility to transfer the pattern information carrying light beams leaving the optical fiber array 2 towards the light sensitive elements 11 embedded in the modulation means is the use of planar optical wave-guides. Planar optical wave-guides can be thought of as optical fibers embedded into or onto a substrate. Consider again the array of modulation means 3. Planar optical wave-guides may be integrated in this array. Then a system as schematically shown in FIG. 7 can be constructed. Each individual pattern information carrying light beam 8 leaving the optical fiber array 2 has to be coupled into the corresponding optical wave-guide 16. This can be done directly or via an array of lenses 17 as shown in FIG. 7. Each lens then couples an individual pattern information carrying light beam 5 into the entrance point of the corresponding planar optical wave-guide 16. The optical wave-guide 16 transports the pattern information carrying light beam 8 through the modulation array 3 towards the correct light sensitive element 11. The light sensitive element 11 converts the pattern information carrying light beam 8 into a sequence of signals, which activate or deactivate the modulators 18. Consequently the incoming beamlet will be controlled according to the pattern information. The sequence of signals in this embodiment is transported through electrical wires 19 embedded in the modulation array 3 towards the modulators 18.

Figure 8:
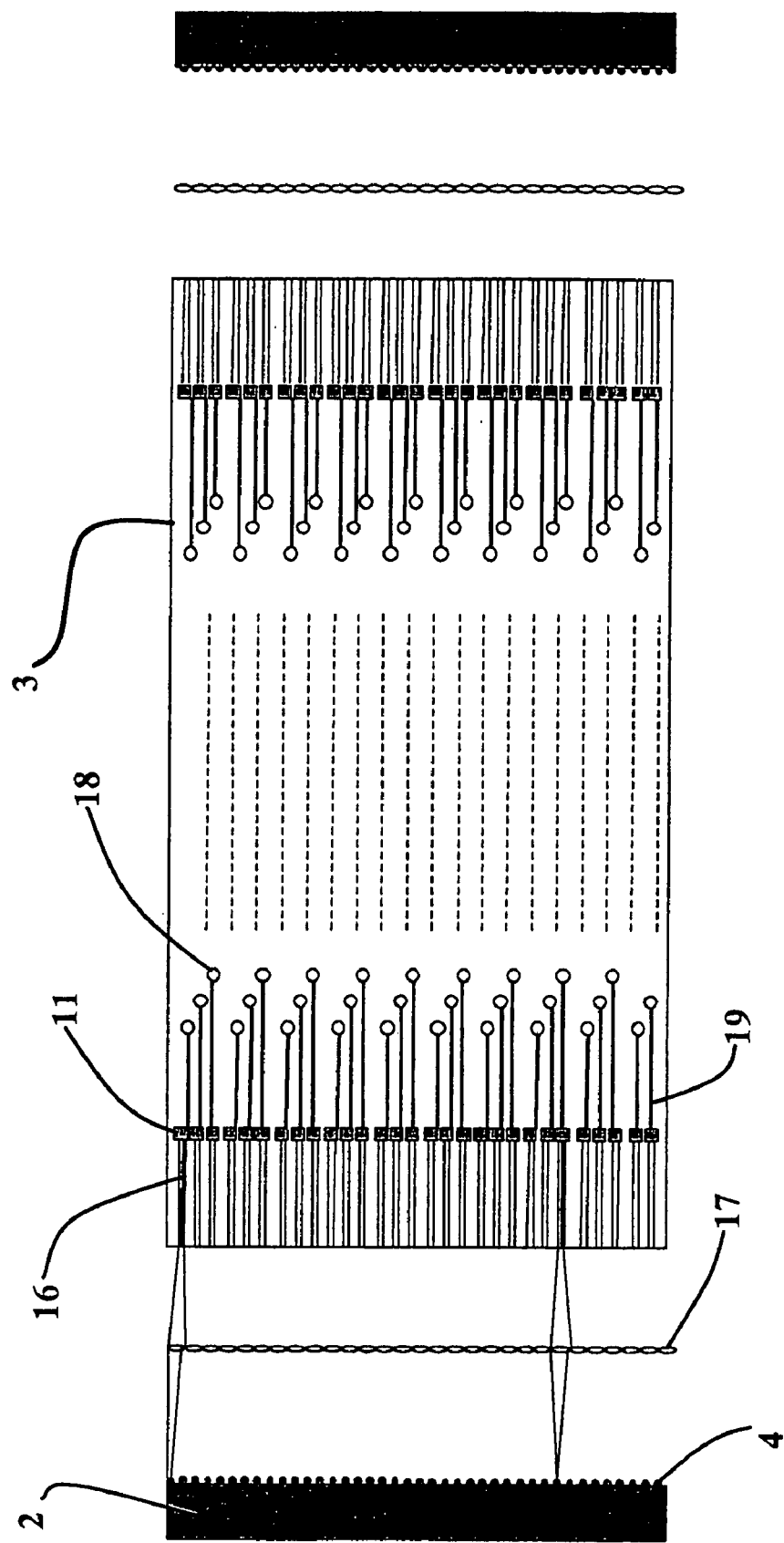

FIG. 8 shows a top view of the same configuration as depicted in FIG. 7. In this case two fiber arrays 2 are used to control all the modulators 18. However, any number of arrays 2 is applicable. The light sensitive elements 11 are represented by squares, while the modulators 18 are represented by circles. Only two trajectories of pattern information carrying light beams 8 are shown for clarity.

Optical Fibers

Figure 9:
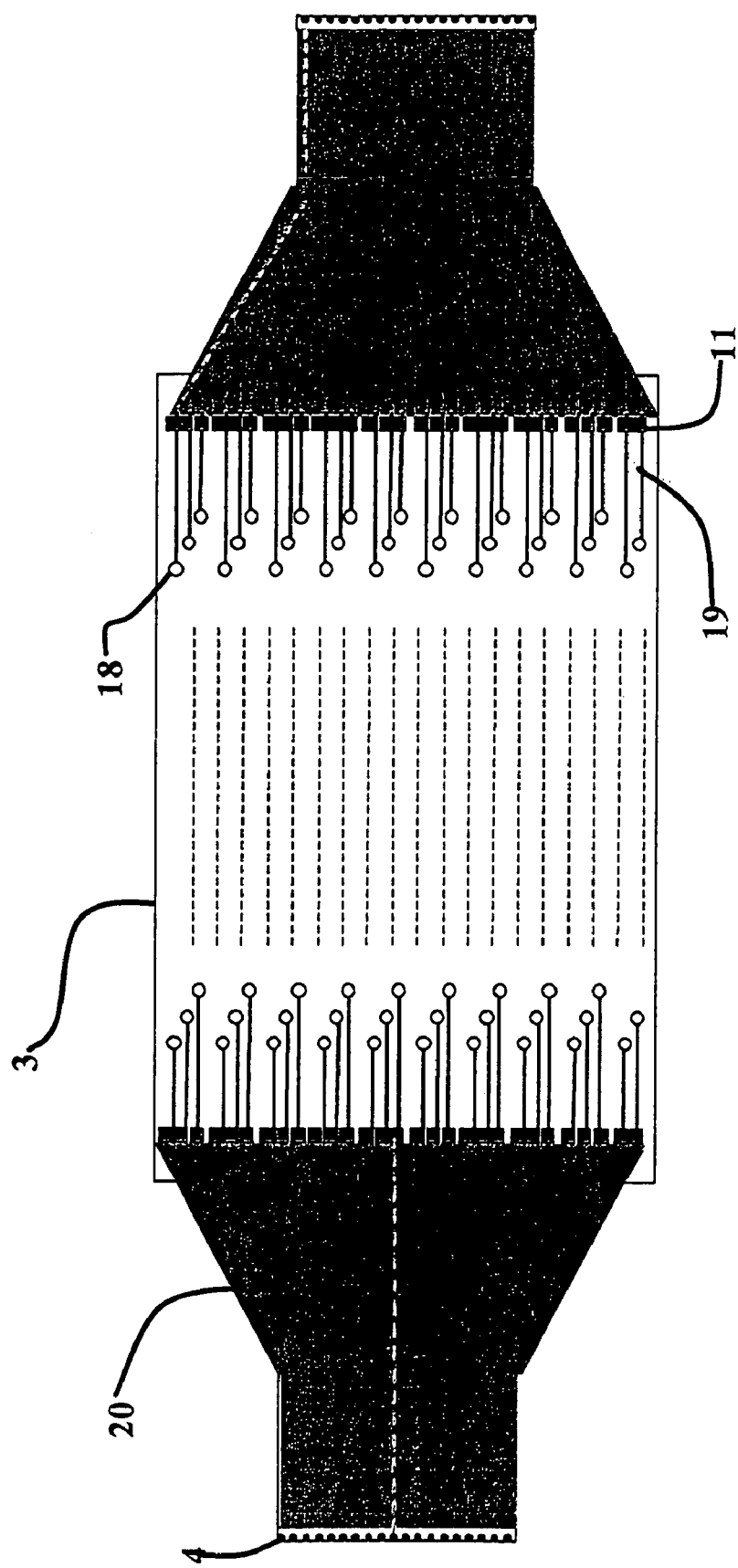

The third possibility for the data transfer from the control unit towards light sensitive element 11 is to use optical fibers for the entire trajectory. The major problem with this approach is the connection of the individual fibers 4 to the structure wherein the modulation means are integrated. Again imagine that a modulation array 3 is used. Connecting the individual fibers 4 to this array 3 may give problems when for instance this array 3 is moving for scanning purposes. Mechanisms like stress and friction are introduced in the region of attachment. Eventually the connection can break. A possible measure to avoid this problem is to combine a group of optical fibers 4 to form a fiber ribbon 20. The ribbon 20 is then connected to at the side of the modulation array 3 as shown in FIG. 9. In the figure two ribbons 20 are shown. Another number of ribbons 20 is also possible. Two exemplary trajectories of optical fibers within the fiber ribbon are schematically shown with dashed lines. The light sensitive elements 11, represented in the figure as squares, may be located close to the contact of the fiber ribbon 20 with the modulation array 3, but they may also be located closer to the incoming beamlets. Preferably the optical signals are converted in electrical signals. The electrical signals are transferred through on-chip electrical wires 19 towards the modulators 18, represented by circles, located in close proximity of the corresponding incoming irradiated beamlets.

EXAMPLES

The next two sections describe two examples of maskless lithography systems embodied by the present invention.

Example 1

Maskless Electron Beam Lithography System

Figure 10:
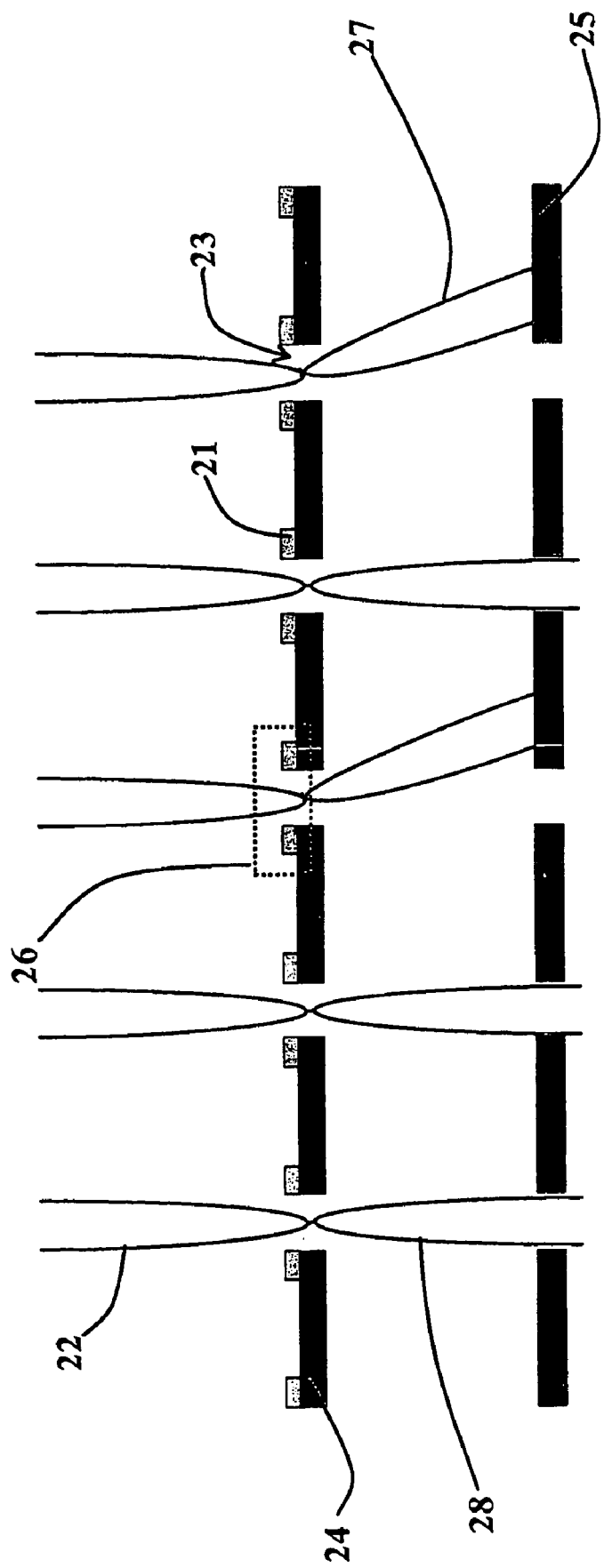
Figure 11:
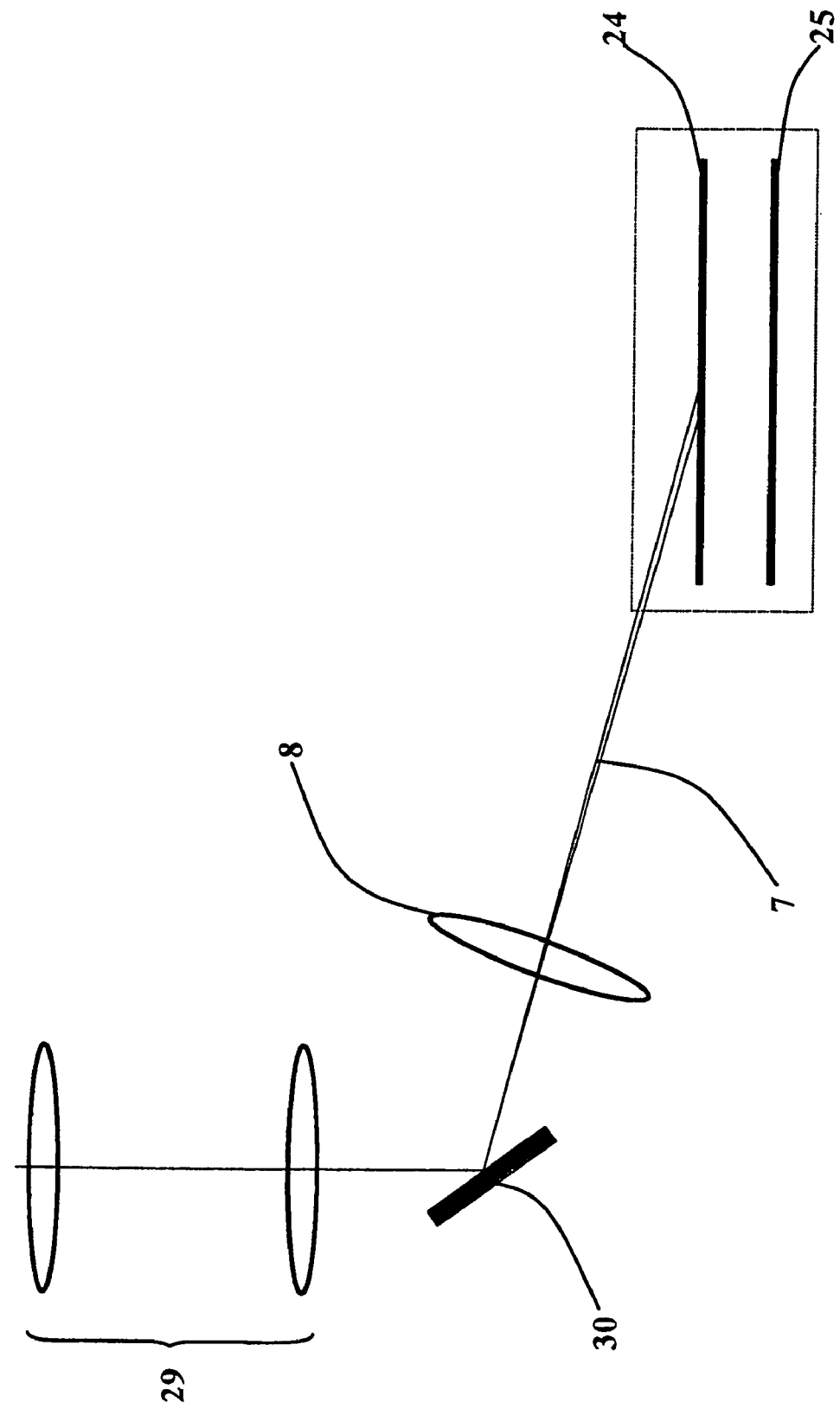
Figure 12:
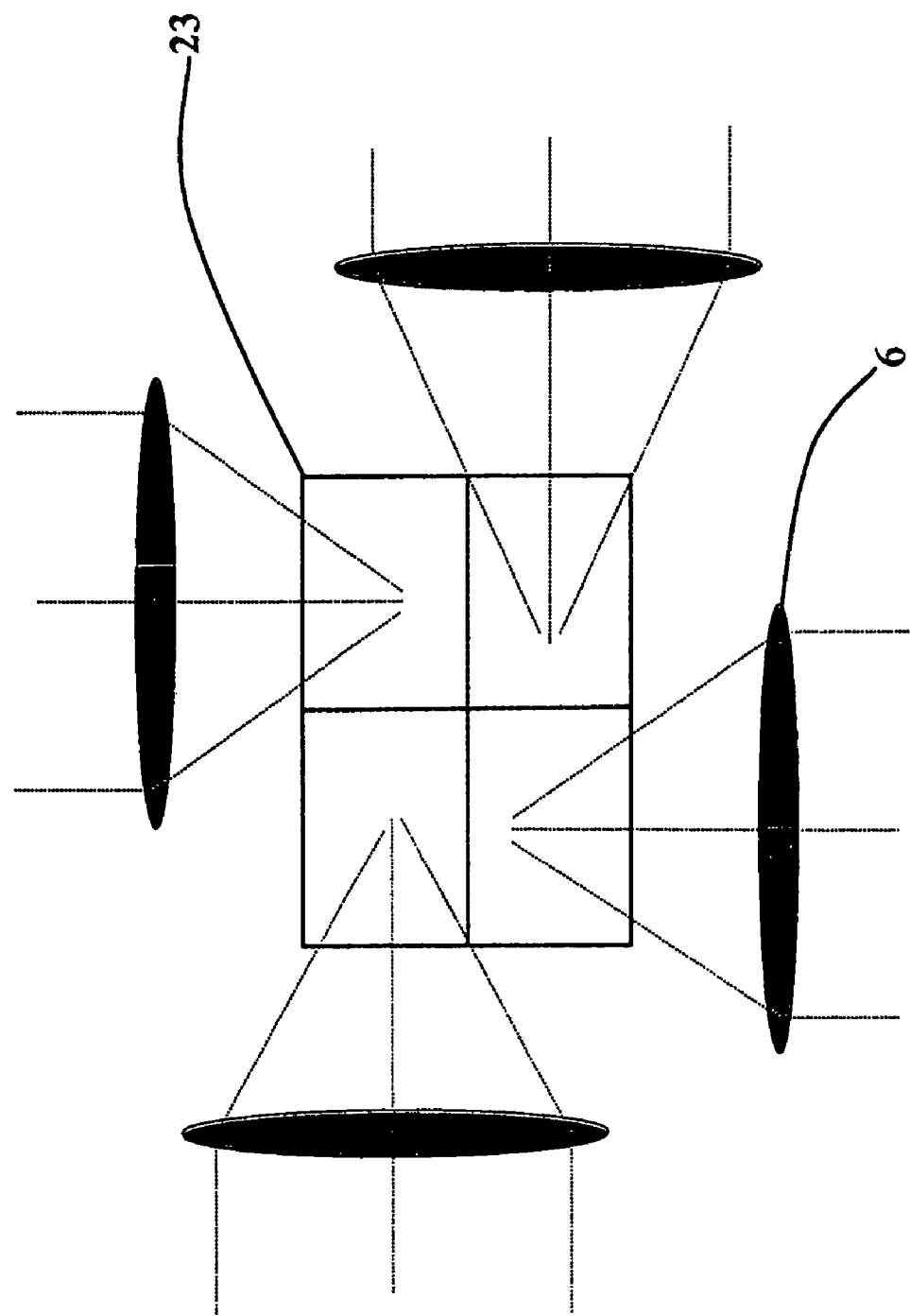

FIGS. 10–12 show several parts of this system. In the maskless electron beam lithography system used in this example, the system comprises an aperture plate comprising electrostatic deflectors 21 to deflect incoming electron beamlets 22 passing through the apertures 23. This plate will be referred to as the beamlet blanker array 24. When the electron beamlets 22 have passed the beamlet blanker array 24 they will reach a second aperture array on which their trajectory will terminate when they are deflected. The second plate is referred to as the beamlet stop array 25.

The modulation concept of this lithography system is shown in FIG. 10. Incoming electron beamlets 22 are projected on the beamlet blanker array 24. The positions of the electron beamlets 22 correspond to the positions of the apertures 23 in the plate 24. The beamlet blanker plate 24 comprises a deflector element as modulation means. In this example said deflector element comprises an electrostatic deflector 21. Depending on the received information the deflector 21 located in the beam blanker array 24 will be turned on or off. When the deflector 21 is turned on, an electric field is established across the aperture 23, which results in a deflection of the beamlet 22 passing this aperture 23. The deflected electron beamlet 27 will then be stopped by the beamlet stop array 25. In this case no information will reach the target exposure surface. When the deflector 21 is turned off the beamlet will be transmitted. Each transmitted beamlet 28 will be focused on the target exposure surface. By moving the target exposure surface and the assembly of arrays relatively to one another and by scanning the beamlets with for instance an additional beamlet deflector array a pattern can be written.

FIG. 11 shows a possible configuration of the usage of free space interconnects in this maskless lithography system. The pattern information carrying light beams 8 coming out of the data storage medium in the control unit leaving the optical fiber array 2 are demagnified by two lenses 29 Alternatively also other configurations as for instance shown in FIG. 5 can be used. The pattern information carrying light beams 8 are then projected on the beamlet blanker plate 24 with a mirror 30 and a focusing lens 7. The angle of incidence α ranges from 0 and 80 degrees. If _ is larger than 80 degrees or a smaller angle is desired due to other complications the beamlet blanker plate 24 can be illuminated with more than one fiber array 2 as is shown in FIG. 12. In the depicted situation 4 fiber arrays 2 are illuminating the beamlet blanker plate 24. In FIG. 12 the 4 corresponding focusing lenses 7 are depicted, focusing the pattern information carrying light beams 8 on the respective part of the beamlet blanker plate 24.

Example 2

Maskless EUV-Light Optical Lithography System

Figure 13:
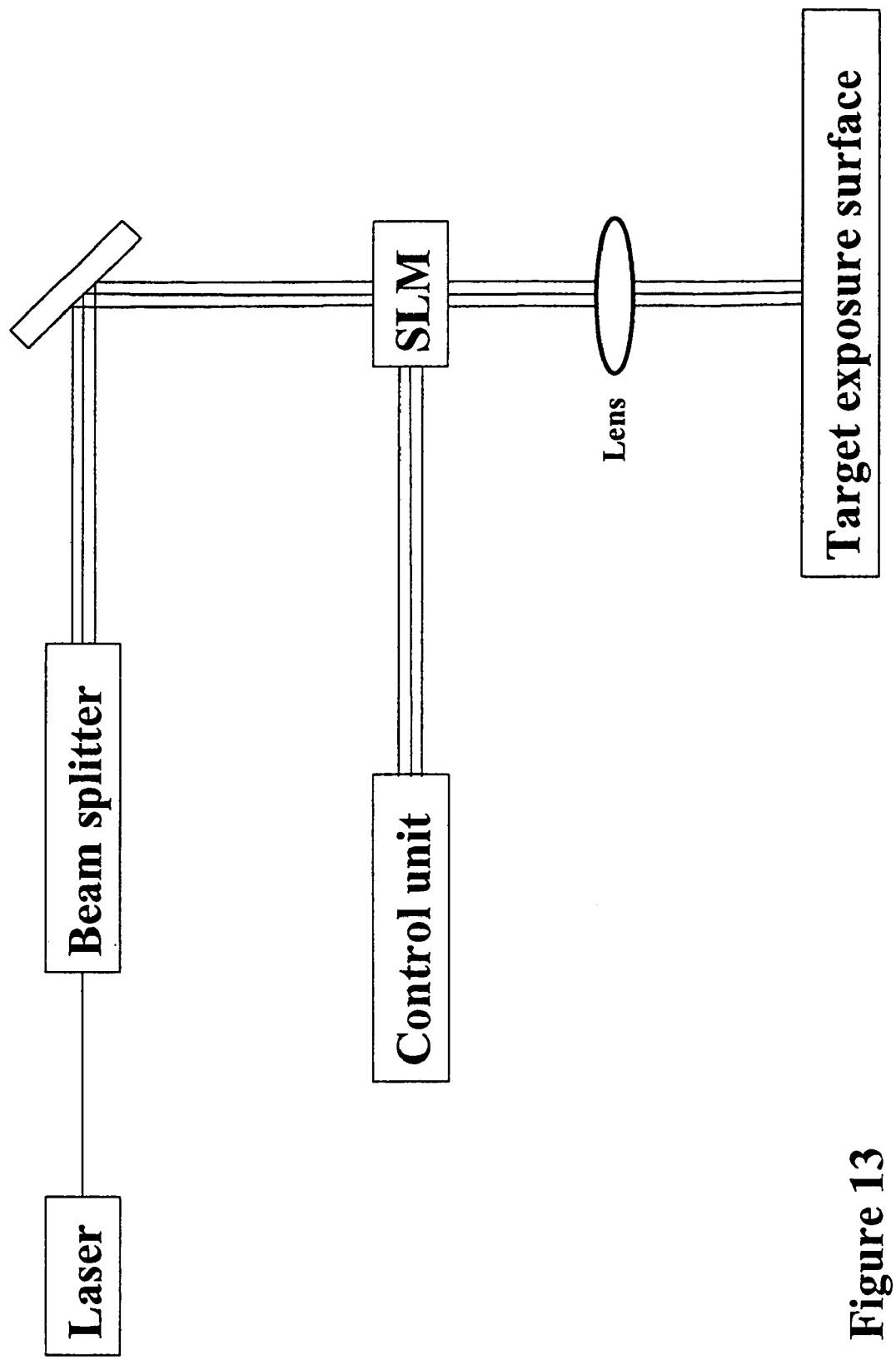

The maskless EUV system in this example, schematically shown in FIG. 13, comprises a spatial light modulator (SLM). Maskless lithography systems using an SLM can be found in for instance WO0118606. The SLM comprises an array of mirrors, which reflect the incoming light beams in such a way that the beam eventually is blanked or transmitted. An example of such an SLM is a deformable mirror device (DMD). A DMD is controlled in the same way as the electrostatic deflector array shown in the first example. The modulation signals couple into the system from the back or from the side. The most probable configuration would be a backside control of the modulation. By providing the backside of each mirror with a light sensitive element, the control can be done with the use of the same optical carriers as mentioned before. Probably the use of free space optical interconnects is the most convenient option.

A schematic drawing of the operation is shown in FIG. 13. A laser emits a light beam, which is split into a plurality of beamlets by a beam splitter. The plurality of beamlets is projected on the SLM. The pattern information carrying light beams sent from the control unit towards the SLM control the transmission probability of beamlets coming from the beam splitter. The transmitted beamlets are focused on the target exposure surface with a lens. By moving the target exposure surface and the rest of the system relatively to each other a pattern can be written.

Figure 14:
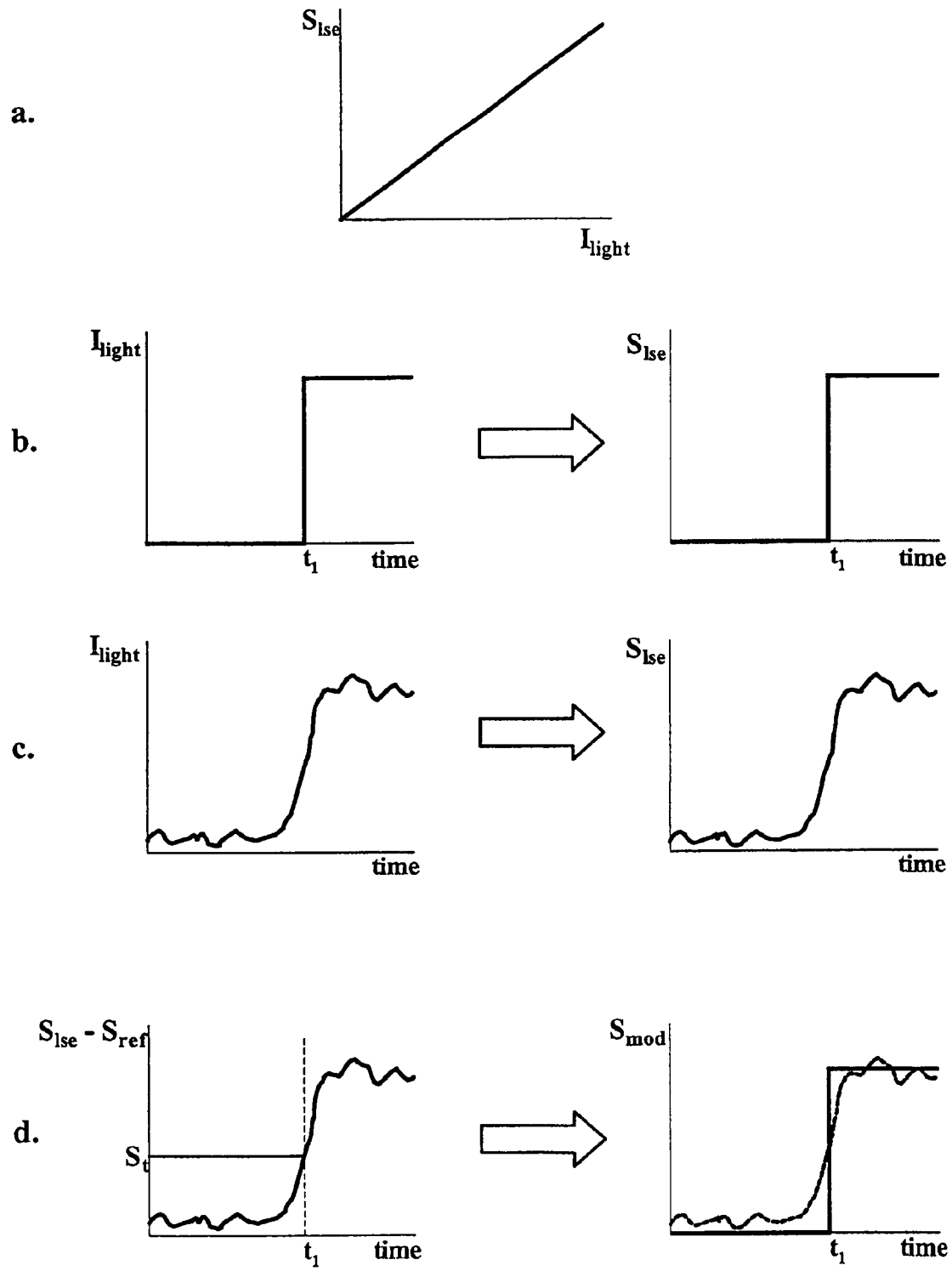
FIGS. 14a–14d illustrate a problem with optical transmission of signals.

The operation of the modulation means is furthermore influenced by characteristics of the data converter in the control unit, which emits the at least one pattern data carrying light beam. The light falling on the light sensitive element generates a photon-induced signal, $S_{lse}$. In most light sensitive elements a higher intensity of the incoming light, $I_{light}$, generates a more intense signal as is shown in FIG. 14a. The created signal can either be a modulated current or a modulated potential, which value follows the intensity changes of the light emitted by the data converter in the control unit.

Consider the ideal operation of the modulation means with two modulation options: the beamlets are either modulated or not. Following the mode of operation depicted in FIG. 14a, the output signal of the light sensitive element switches from an "off"-state to an "on"-state upon the reception of a light beam as is depicted in FIG. 14b. It remains in this situation until the control signal turns "off" again, i.e. until no light is detected by the light sensitive element. However, the pattern data carrying light beam emitted by said data converter in the control unit has unintended intensity variations. Furthermore the intensity of the light when the control unit sends an "off"-signal is not always zero. The results of these variations and offset are shown in FIG. 14c. The variations and offset in the light intensity cause similar variations in the output signal generated by the light sensitive element. The beamlets modulated with this signal experience unintended displacements and aberrations. Consequently patterning a surface of a target with high-resolution features becomes extremely difficult, if not impossible.

In an embodiment of the present invention, the aforementioned performance limitations are avoided by providing each modulator with discretizing means. The continuous output signal of the light sensitive element serves as an input signal to this discretizing means. The output signal of the discretizing means, which is the signal responsible for the actual modulation of the beamlets, is a continuous signal with a set of discrete, allowable and predetermined values. In the easiest case, the binary case, the output signal resulting from the discretizing means can have two values: one value corresponding with "modulation on", the other value corresponding with "modulation off".

The discretizing means preferably comprises a comparator circuit of some sort. When the output signal is a potential, a potential comparator circuit of some form can be used to create a discrete set of possible values of the output modulation potential. In the case that the light sensitive element is used as a current source, a current comparator circuit of some form can be used to discretize the signal and provide a modulation current which can have a limited set of allowable, discrete values. Additionally, the discretizing means can be provided with an IV or VI-converter. By adding the converter it becomes possible to compare a current and a voltage.

A comparator generally has two input signals and one output signal. Often, one input is a constant reference signal $S_{ref}$, and the other input signal is a time-varying signal. The time-varying signal used in the present invention is the output signal of the light sensitive element, $S_{lse}$. The comparator compares the input value of $S_{lse}$ with the reference value of $S_{ref}$. When the difference stays below a certain threshold value, $S_t$, the output signal is in a first state, wherein the value of this signal is fixed at a fixed first value. When the difference exceeds the threshold value due to for instance the reception of an optical control signal by the light sensitive element, the output signal switches to a second state. In this state the signal has a second fixed value, different from said first fixed value. A further increase of the difference does not change the value of the output signal anymore. Only a decrease of the difference below the threshold value, for instance caused by the removal of the optical signal falling on the light sensitive element, resets the modulation potential back to its first state. In the present invention the discretized output signal of the comparator is used as modulation signal $S_{mod}$.

The consequences of the addition of the discretizing means on the modulation signal in the binary case are shown in FIG. 14d. The modulation signal switches at $t_l$ between said first fixed value to said second fixed value because at that time the difference between the values of $S_{lse}$ and $S_{ref}$ exceeds said threshold value $S_t$. The threshold value can be tuned by accurate selection of suitable components.

Figure 15:
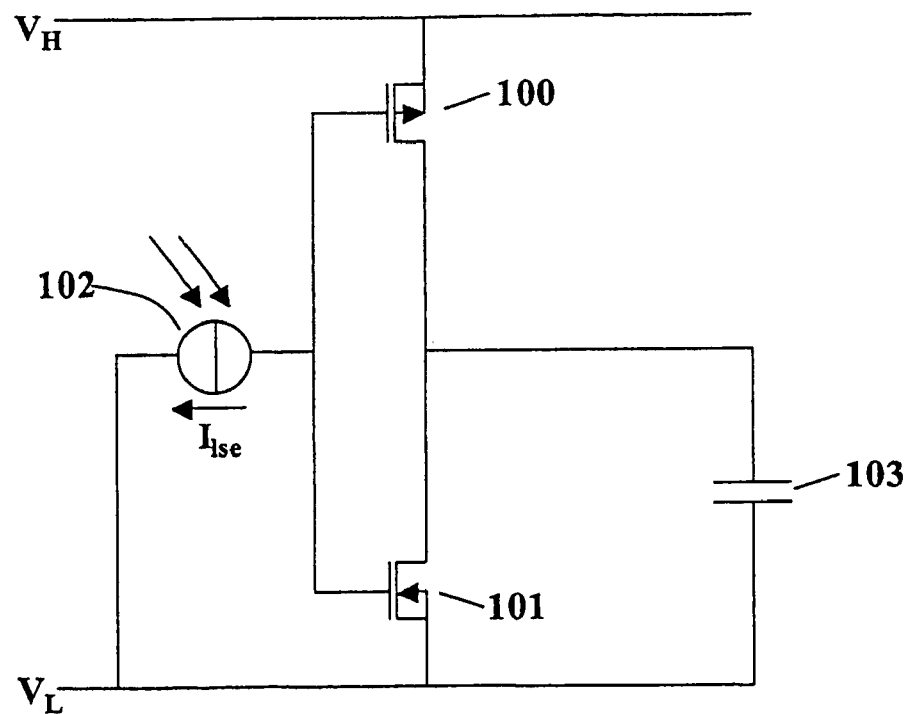
FIG. 15 shows a circuit for a modulator according to the present invention.

Consider the example of the beam blanker array (BBA). FIG. 15 shows an inverter circuit that is used to charge and discharge the deflector electrodes upon the reception of corresponding optical control signals. The circuit is able to switch between two predetermined well-defined voltages, a high potential $V_h$ and a low potential $V_l$. The circuit comprises a PMOS-transistor (upper transistor) 100 and an NMOS-transistor (lower transistor) 101. The base of both transistors 100 and 101 are connected to each other and to the lightsensitive element 102. The collectors of both transistors are also connected to each other. The emitter of transistor 100 is connected to high potential $V_h$ and the emitter of transistor 101 to low potential $V_l$. The collector of both transistors 100 and 101 are also via capacitor 103 connected to low potential $V_l$. The circuit of FIG. 14 operates in the following way following the first mode of operation.

When light is detected by the light sensitive element a photon-induced current $I_{lse}$ is created. In this circuit the light sensitive element 102 thus serves as a light sensitive current source. The capacitor 103 between the gate and the source serves as an IV-converter, since it behaves as a resistor at high frequencies. So the current charges the capacitors of the transistors 100, 101 such that:

$$V_{GS,PMOS} - V_H > V_{T,PMOS} \text{ and}$$

$$V_{GS,NMOS} - V_L < V_{T,NMOS}$$

wherein $V_{GS}$ is the gate-source voltage and $V_T$ the threshold voltage of the PMOS-transistor 100 and the NMOS-transistor 101 respectively. As a result the PMOS-transistor 100 now switches "on" and the NMOS-transistor 101 switches "off". The established current between drain and source of the PMOS-transistor 100 charges the deflection electrode to a potential equal to $V_H$. Consequently the charged particle beam passing through a corresponding aperture is deflected.

When no light is incident on the light sensitive element, the conditions change such that:

$$V_{GS,PMOS} - V_H < V_{T,PMOS} \text{ and}$$

$$V_{GS,NMOS} - V_L > V_{T,NMOS}$$

Thus the NMOS-transistor 101 switches "on" and the PMOS-transistor 100 is switched "off". Consequently the deflector electrode discharges and the initial situation is restored. Note that in this configuration shown two threshold values are used.

It is also possible to use more threshold values by putting additional inverter circuits as shown in FIG. 15 in parallel. Eventually a discrete set of modulation potentials can be created thus enabling controlled modulation of the beam intensity of each individual passing charged particle beamlet. By selecting appropriate transistors an optimized setup can be designed for each individual case. The use of more than one threshold values is not limited to this example. In fact the use of more than one threshold value can be useful in any maskless lithography system, especially in lithography systems embodying "gray writing" i.e. a patterning method using a discrete set of dose values.

Figure 16:
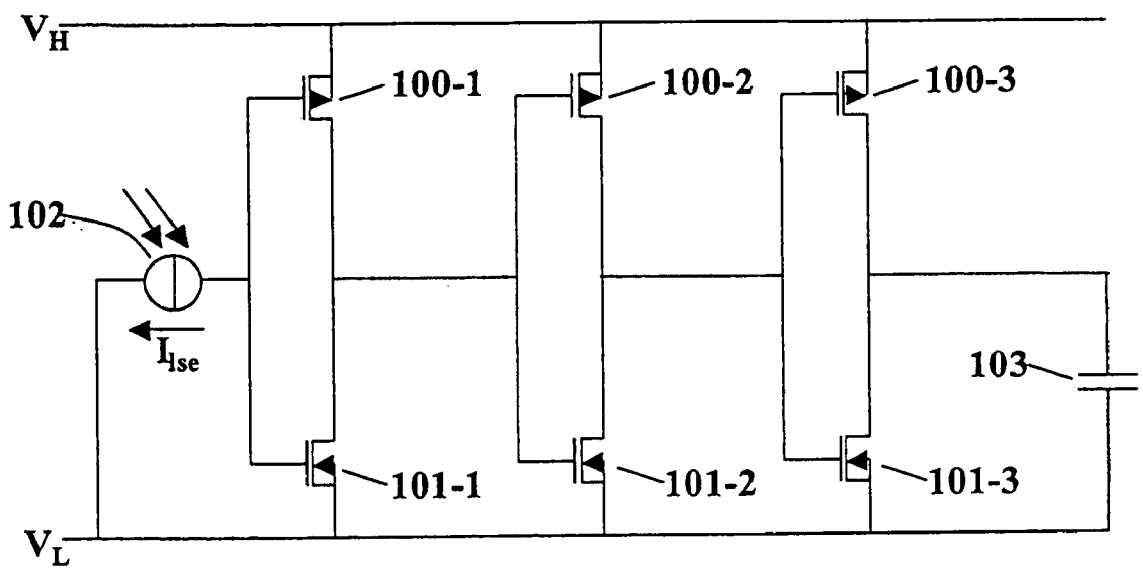
FIG. 16 shows a further embodiment of a circuit for a modulator according to the present invention.

The circuitry depicted in FIG. 15 works best at a high frequency when the capacitance of the used transistors is of the same order of magnitude as the sum of the parasitic capacitance and the capacitance between the electrodes of the electrostatic deflector. When the capacitance of the transistors is much smaller than the modulation capacitance, the applied current needs to be amplified. The amplification of the applied current can for example be established by putting several inverters (transistors 100 and 101)) in series as schematically shown in FIG. 16. The transistors (100-1, 100-2, 100-3, 101-1, 101-2, 101-3) in each consecutive stage (i.e. stage with 100-1 and 101-1, stage with 100-2 and 101-2, stage with 100-3 and 101-3) are designed to operate with a higher current than the stage before.

Figure 17:
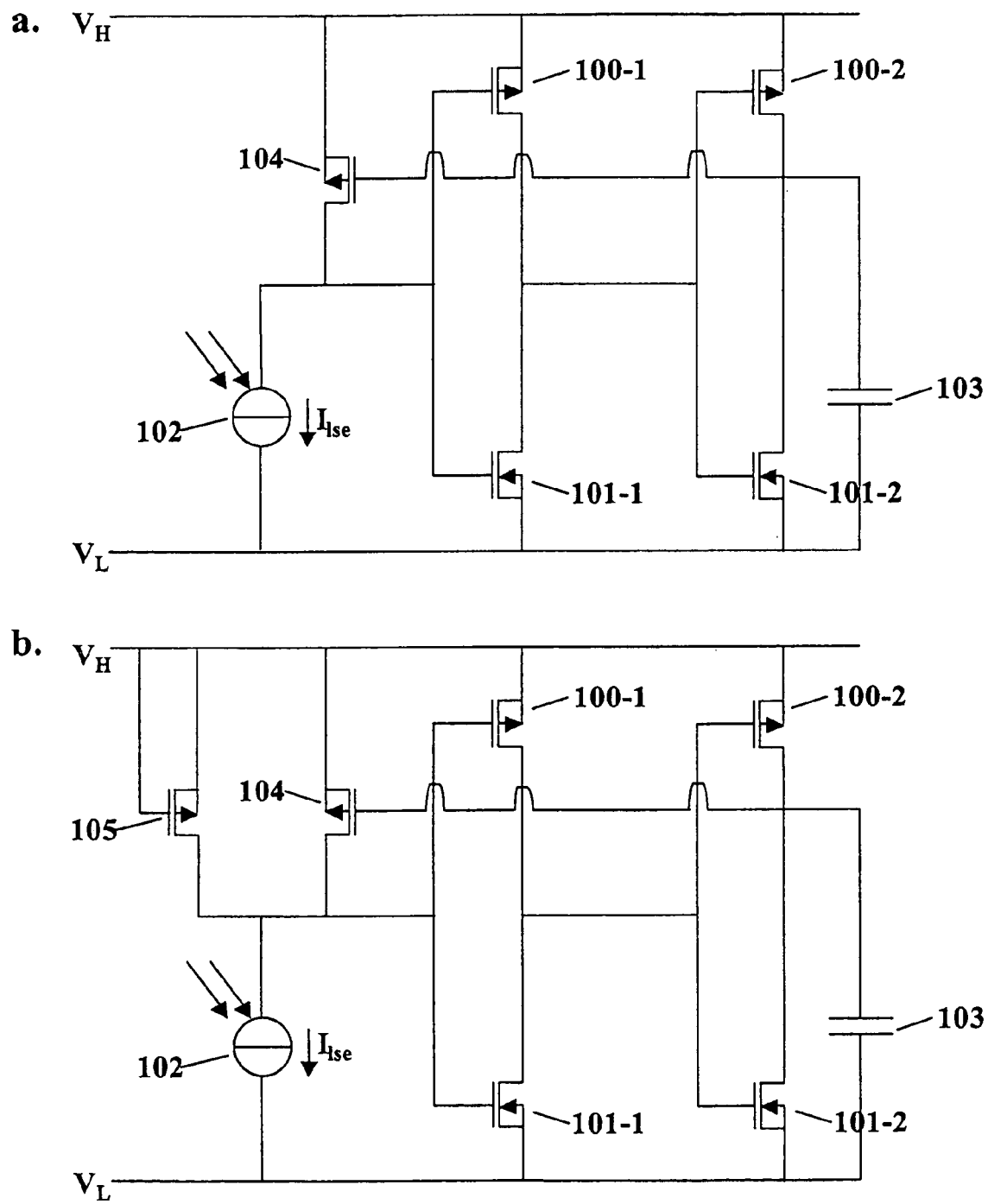
FIGS. 17a–17b show two further embodiments of circuits for a modulator according to the present invention.

The performance of the circuits depicted in FIGS. 15 and 16 operate less successful at lower frequencies. At these lower frequencies, the input potential of the inverter circuit can become undefined, and it may take too much time to reset the value in time for a next cycle of operation. Under these conditions a feedback mechanism can improve this. FIG. 17a shows a circuit comprising a feedback arrangement with a PMOS transistor 104. In this circuit, capacitor 103 is not connected to both collectors, but to the base of transistor 104. The emitter of transistor 104 is connected to high potential $V_h$ and its collector to light sensitive element 102.

The feedback arrangement resets the input signal of the inverter circuit and keeps it at this value until light is falling on the light sensitive element again. Note that the specific configuration shown only operates successfully in the second mode of operation, schematically shown in FIG. 14b i.e. light signal on means electrostatic deflection off. Again the current can be amplified using an arrangement similar to the one shown in FIG. 16. However, an even number of inverters is preferred, as arrangements with an odd number of inverters operate less successfull at a low-frequencies.

A leakage current through the feedback transistor 104 has a negative influence on the performance of the circuit. To avoid said influence a second complementary transistor 105 can be positioned in parallel with the feedback transistor 104 as is depicted in FIG. 17b. The leakage current through the feedback transistor 104 is now entirely compensated by the leakage current through said complementary transistor 105 which is connected with its collector to the light sensitive element and with its base and its emitter to high potential $V_h$. Effectively no leakage current is experienced.

Figure 18:
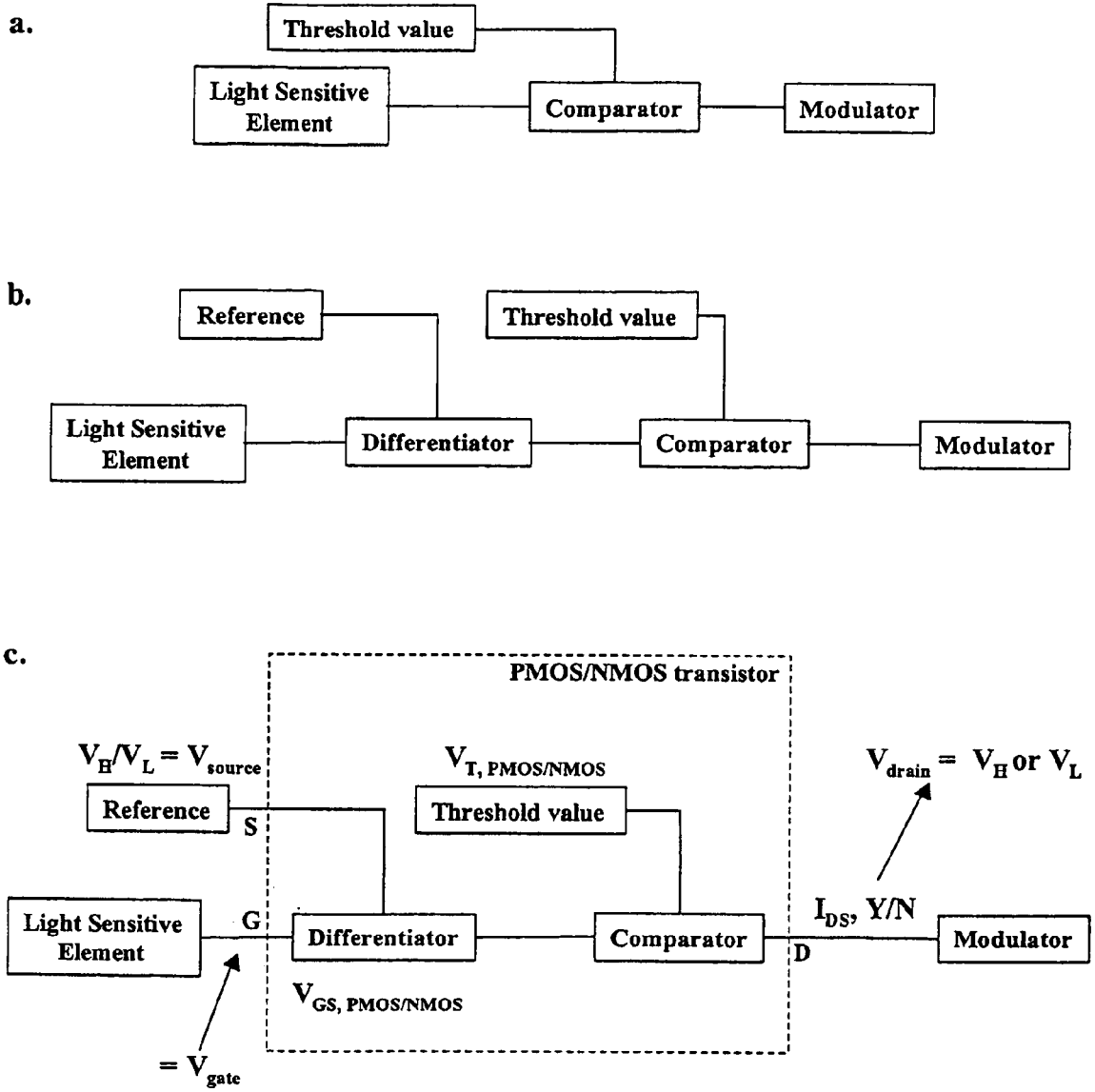
FIGS. 18a–18e illustrate functional charts of discretizing means.
Figure 18:
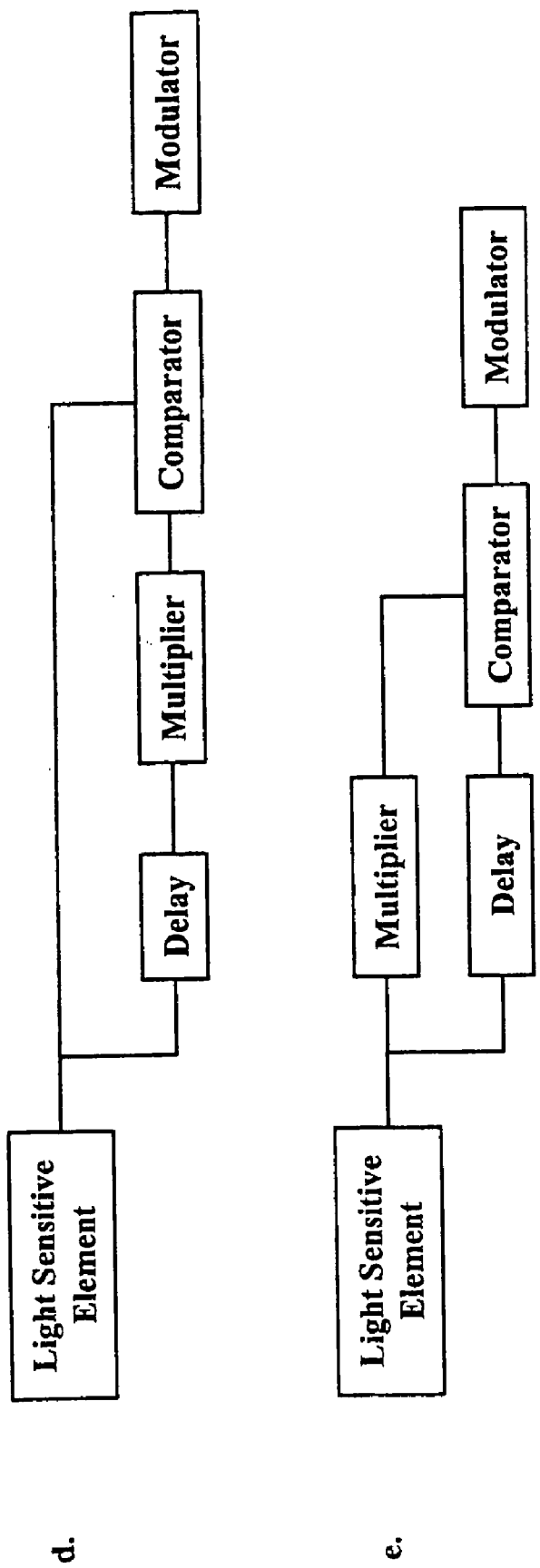

FIG. 18 illustrates the functions of the discretizing means. The easiest embodiment of said discretizing means only comprises a comparator as is depicted in FIG. 18a. The comparator compares two input values, and depending on the result of said comparison, an output value is assigned. In the present invention the input value is the value of the signal created by the light sensitive element $S_{lse}$. The second input value I is a certain predefined threshold value. The output value is chosen from a set of predetermined values and depends on the result of the comparison.

Said output value is then assigned to the modulation signal $S_{mod}$, which modulates the beamlet responsible for patterning the surface to be exposed. In numerous cases the range of the signal generated by the light sensitive element is not aligned properly with the threshold value. This problem can be solved by a adding at least one differentiator to the discretizing means as is shown in FIG. 18b. Before reaching the comparator the input coming from the light sensitive element $S_{lse}$, is properly adjusted by subtracting a reference signal $S_{ref}$ from $S_{lse}$. The difference, $S_{lse}-S_{ref}$, is then compared with the threshold value by the comparator. The embodiments shown in FIGS. 15–17 all operate with the mechanism shown in FIG. 18b as depicted in FIG. 18c. The reference signals correspond with the signals at a constant value, $V_H$ and $V_L$ and are connected to the source-side of the transistors. The threshold value, $V_T$, is an intrinsic value of each transistor. The signal $S_{lse}$ is applied to the gate of the transistor. The comparator now compares the gate-source difference and the threshold value in each transistor and decides whether a current $I_{DS}$ can run or not. A suitable configuration of these elements then results in the desired discretizing operation.

Another embodiment of the discretizing means is shown in FIGS. 18d end 18e. In FIG. 18d, the signal from the light sensitive element is directed directly to a comparator, and via a delay and, optionally, a multiplier, to the comparator. This circuitry is also called constant fraction discriminator. In this way, not a constant, predefined threshold is used. The threshold is in fact based upon the difference between the value of the current signal and the value of the signal a predefined amount of time ago (depending on the delay). A variation on this embodiment is shown in FIG. 18e.

Figure 19:
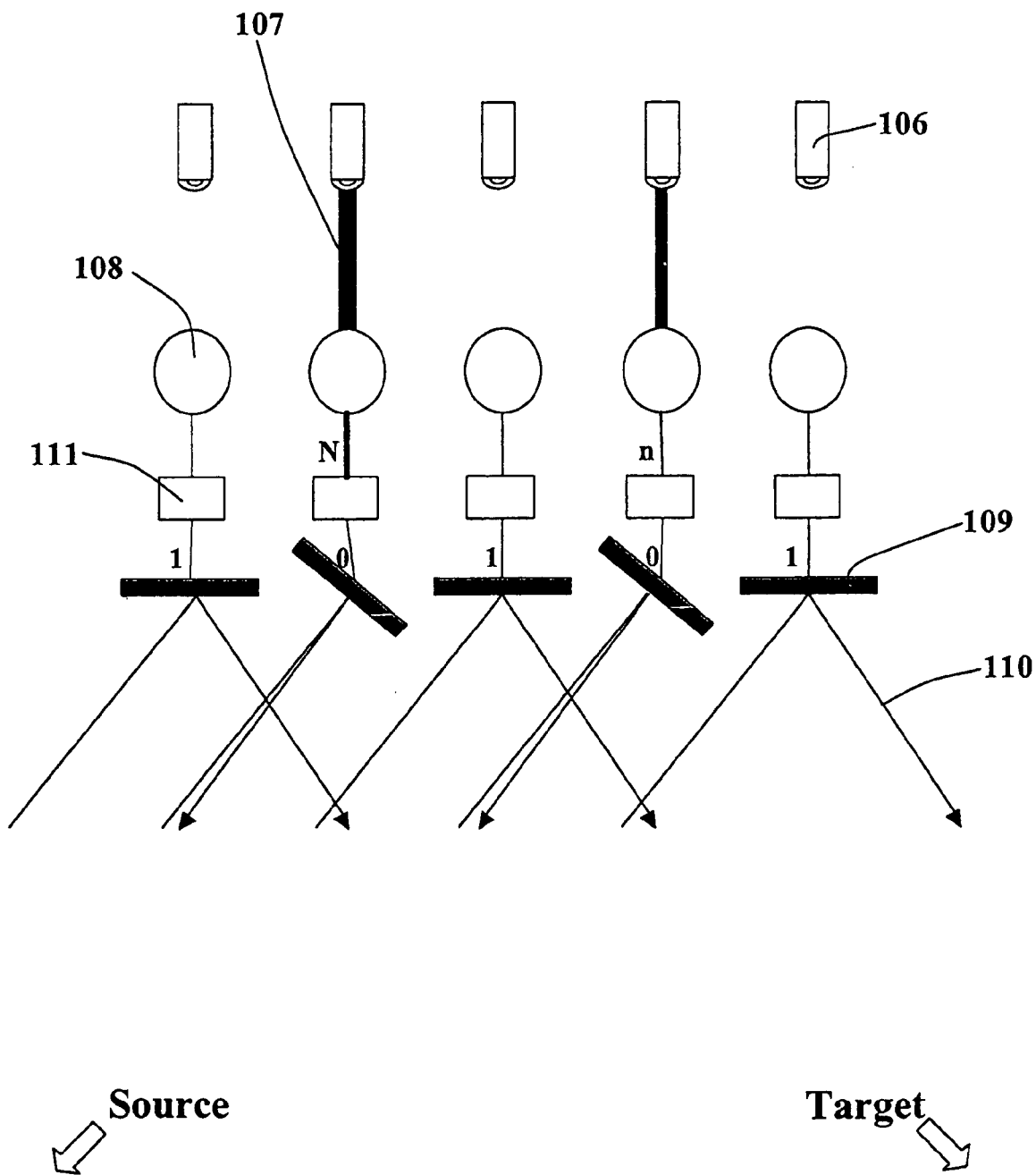
FIG. 19 shows an modulator array for a multi-beamlet optical lithography system.

Not only a maskless charged particle lithography system but also a maskless optical lithography system can be provided with discretizing means. An example of a modulator array in the latter system is shown in FIG. 19. In the shown configuration optical beamlets 107 are projected on an array of micro-mirrors 109. Upon recieving (or interruption) of a control signal the direction of reflection changes.

According to the current invention, the control signals are sent optically, in the shown embodiment through fibers 106 and free space, towards corresponding light sensitive elements 108. Again intensity differences in these optical control signals lead to different intensities of the resulting electrical control signals created by said light sensitive elements 108.

In FIG. 19, the second control line from the left transfers a signal with a large intensity N, larger than the intensity n of the fourth control line, which only carries a signal with an intensity n. This is due to the smaller intensity of the optical control signal falling on the light sensitive element 108 of the latter control line. If these signals would be directly applied to the corresponding micro-mirrors 109, the corresponding beamlets 110 exposing the target surface would be reflected at different angles. To eliminate this difference, discretizing means 111 are positioned between the light sensitive elements 108 and their corresponding micro-mirrors 109. As a result, mirrors 109 deflect the beamlets 110 that expose the target surface in an identical way upon receiving an optical control signal, independent of the intensity of the optical control signal 107.

In this particular embodiment shown in FIG. 19, the reception of an optical control signal results in a reflection of the exposure beamlets 110 in direction close to the source and away from the target. This state is denoted in FIG. 18 as "0". Without the reception of the signal the exposure beamlets will reach the target. The corresponding state is denoted in FIG. 19 as "1".

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

The invention claimed is:

1. A modulator for modulating the magnitude of a beamlet in a multi-beamlet lithography system, said modulator comprising:
   at least one means for influencing the direction of a beamlet;
   a light sensitive element for receiving light from a modulated light beam and converting said light into a signal;
   discretizing means, operationally coupling to said light sensitive element and to at least one of means for influencing, for converting said signal received from said light sensitive element into a discrete signal having discrete values selected from a set of predefined discrete values and providing said discrete signal to said means for influencing.

2. The modulator according to claim 1, further comprising a passage for said beamlet, wherein said means for influencing are located near said passage.

3. The modulator according to claim 2, said modulator being a modulator for modulating the magnitude of a charged particle beamlet in said multi-beamlet lithography system, said means for influencing comprising at least one electrode, located near said passage for generating an electrical field for influencing said charged particle beamlet, and said discretizing means coupling to said light sensitive element and to at least one of said at least one electrodes.

4. The modulator according to claim 1, said modulator being a modulator for modulating the magnitude of an optical beamlet in a multi-beamlet lithography system, said means for influencing being located in the optical path of said beamlet.

5. The modulator according to claim 4, said means for influencing comprising at least one deflector for deflecting an optical beamlet.

6. The modulator according to claim 5, further comprising means for modifying the deflection angle of the deflector, said means for modifying being coupled to said discretizing means.

7. The modulator of claim 1, wherein said discretizing means comprises at least one comparator circuit, which provides the functionalities of:
   providing a first difference between said signal and a reference signal;
   providing a second difference between at least one threshold value and said first difference;
   providing a discrete value selected from said set of predefined discrete values, based on the magnitude of said second difference.

8. The modulator of claim 1, wherein said discretizing means comprises a discretizing circuit comprising:
   A first differentiator, coupled to said light sensitive element, for calculating a first differential signal from the signal and a reference signal,
   A second differentiator, coupled to said first differentiator, for calculating a second differential signal from said first differential signal and a threshold signal;
   A converter, coupled to said second differentiator for converting said second differential signal into discrete values, selected from said set of predefined discrete values.

9. The modulator according to claim 8, wherein the discretizing circuit is an inverter circuit comprising a transistor of the PMOS-type and a transistor of the NMOS-type.

10. The modulator according to claim 9, the discretizing circuit comprising a number of inverters in series, wherein at least one inverter is provided with a transistor of the PMOS-type and a transistor of the NMOS-type.

11. The modulator according to claim 10, wherein said number of inverters in series is an even number.

12. The modulator according to claim 11, wherein each consecutive inverter in said number of inverters in series comprises transistors designed to operate with a higher current than the transistors in the previous inverter in said number of inverters in series.

13. The modulator according to claim 1, wherein said signal is a time-varying electrical potential.

14. The modulator according to claim 1, wherein said signal is a time-varying electrical current.

15. The modulator according to claim 1, wherein the discretizing means comprises thresholding means for defining said discrete values.

16. The modulator according to claim 15, wherein said thresholding means hold at least one predefined threshold value.

17. The modulator according to claim 15, wherein said thresholding means is adapted fro defining a threshold value based on the signal.

18. The modulator according to claim 15, wherein said thresholding means is adapted for defining a threshold value based on a previous state of the signal, and/or based on a differential of the signal, and/or based on an integral of the signal and/or previous discrete value.

19. A modulator array comprising a plurality of modulators, for modulating a magnitude of a plurality of beamlets in a multi-beamlet lithography system, each modulator comprising:
- at least one means for influencing the direction of a beamlet;
- a light sensitive element for receiving light from a modulated light beam and converting said light into a signal;
- discretizing means, operationally coupling to said light sensitive element and to at least one of means for influencing, for converting said signal received from said light sensitive element into a discrete signal having discrete values selected from a set of predefined discrete values and providing said discrete signal to said means for influencing.

20. The modulator array according to claim 19, wherein the discretizing means comprises thresholding means for defining said discrete values.

21. The modulator array according to claim 20, wherein said thresholding means hold at least one predefined threshold value.

22. The modulator array according to claim 20, wherein said thresholding means is adapted for defining a threshold value based on the signal.

23. The modulator array according to claim 20, wherein said thresholding means is adapted for defining a threshold value based on a previous state of the signal, and/or based on a differential of the signal, and/or based on in integral of the signal and/or previous discrete value.

24. A multi-beamlet lithography system, comprising:
- a source for generating a plurality of beamlets;
- a modulator array comprising a plurality of modulators for modulating the magnitude of each individual beamlet individually;
- pattern data generating means for generating pattern data representing a pattern to be transferred by the lithography system, and
- optical transmission means for optically transmitting the pattern data to the modulator array in at least one an optical signal,
- wherein said modulator array comprises at least one optical receiver for receiving the at least one optical signal, the receiving means comprising discretizing means for converting the at least one optical signal into discrete signals having discrete values selected from a set of predefined discrete values and providing said discrete signals to said modulators.

25. The lithography system of claim 24, wherein said discretizing means are adapted for converting the at least one optical signal into at least one discrete signal for substantially each modulator.

26. A method for transferring a pattern onto the surface of a target using a lithography system comprising beam generating means for generating a plurality of beamlets and modulation means for individually controllably modulating substantially each beamlet, said method comprising:
- retrieving pattern data from data storage means;
- transforming said pattern data into at least one modulated light beam;
- optically coupling said at least one modulated light beam to said modulation means comprising an array of modulators with at least one modulator for each beamlet, each modulator comprising:
- at least one means for influencing the direction of a beamlet;
- a light sensitive element for receiving light from a modulated light beam and converting said light into a signal;
- discretizing means, operationally coupling to said light sensitive element and to at least one of means for influencing, for converting said signal received from said light sensitive element into a discrete signal having discrete values selected from a set of predefined discrete values and providing said discrete signal to said means for influencing.

27. A modulator for modulating the magnitude of a beamlet in a charged particle beamlet lithography system, said modulator comprising:
- at least one means for influencing the direction of a beamlet;
- a light sensitive element for receiving light from a modulated light beam and converting said light into a signal;
- discretizing means, operationally coupling to said light sensitive element and to at least one of means for influencing, for converting said signal received from said light sensitive element into a discrete signal having discrete values selected from a set of predefined discrete values and providing said discrete signal to said means for influencing, said modulator being a modulator for modulating the magnitude of a charged particle beamlet in said charged particle lithography system, said means for influencing comprising at least one electrode, located near said passage for generating an electrical field for influencing said charged particle beamlet, and said discretizing means coupling to said light sensitive element and to at least one of said at least one electrode.

* * * * *